United States Patent
Ikeda

(10) Patent No.: US 9,729,149 B2
(45) Date of Patent: Aug. 8, 2017

(54) LOW POWER STORAGE DEVICE IN WHICH OPERATION SPEED IS MAINTAINED

(71) Applicant: Semiconductor Energy Laboratory Co., Ltd., Atsugi-shi, Kanagawa-ken (JP)

(72) Inventor: Takayuki Ikeda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 196 days.

(21) Appl. No.: 14/251,993

(22) Filed: Apr. 14, 2014

(65) Prior Publication Data
US 2014/0312932 A1    Oct. 23, 2014

(30) Foreign Application Priority Data

Apr. 19, 2013    (JP) .................................. 2013-087938

(51) Int. Cl.
  H03K 19/00        (2006.01)
  H03K 19/177       (2006.01)
  G11C 11/403       (2006.01)

(52) U.S. Cl.
  CPC ........ *H03K 19/0013* (2013.01); *G11C 11/403* (2013.01); *H03K 19/1776* (2013.01)

(58) Field of Classification Search
  CPC ....... G11C 11/413; G11C 11/412; G11C 8/08; G11C 11/419; G11C 7/12; G11C 7/1045;
  (Continued)

(56) References Cited

U.S. PATENT DOCUMENTS 5,537,060 A * 7/1996 Baek ................................ 326/87
5,550,504 A * 8/1996 Ogihara ......................... 327/537
(Continued)

FOREIGN PATENT DOCUMENTS

EP    1737044 A    12/2006
EP    2226847 A    9/2010
(Continued)

OTHER PUBLICATIONS

International Search Report (Application No. PCT/JP2014/060887) Dated Jul. 1, 2014.
(Continued)

*Primary Examiner* — Dylan White
(74) *Attorney, Agent, or Firm* — Robinson Intellectual Property Law Office; Eric J. Robinson

(57) ABSTRACT

A low-power storage device is provided. The storage device includes a first transistor, a second transistor, a logic element, and a semiconductor element. The second transistor controls supply of a first signal to a gate of the first transistor. When the potential of a second signal to be input is changed from a first potential into a second potential lower than the first potential, the logic element changes the potential of a first terminal of the first transistor from a third potential lower than the second potential into the first potential after the logic element changes the potential of the first terminal of the first transistor from the second potential into the third potential. The semiconductor element has a function of making a second terminal of the first transistor floating. The first transistor includes a channel formation region in an oxide semiconductor film.

17 Claims, 13 Drawing Sheets

(58) Field of Classification Search
CPC ............ G11C 11/417; H03K 19/17736; H03K 19/177; H03K 19/17728; H03K 19/1778; H03K 17/063; H03K 19/1736; H03K 19/17724; H03K 19/1776; H03K 19/17704; H03K 19/018521; H03K 19/17744
USPC ....... 326/37–41, 47, 81–83, 87, 121, 58, 56; 327/537, 543; 365/189.09, 189.16, 365/230.06, 156
See application file for complete search history.

(56) References Cited

U.S. PATENT DOCUMENTS

| | | | |
|---|---|---|---|
| 5,559,465 A * | 9/1996 | Shah | 327/374 |
| 5,568,420 A | 10/1996 | Lim et al. | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,738,281 B2 * | 5/2004 | Yokozeki | G11C 14/0072 365/145 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,075,332 B1 * | 7/2006 | Young et al. | 326/38 |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,759,995 B2 * | 7/2010 | Ishii et al. | 327/214 |
| 9,350,358 B2 * | 5/2016 | Okamoto | H03K 19/1776 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0071039 A1 * | 4/2004 | Fujimori | G11C 14/00 365/232 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0086246 A1 | 4/2007 | Sakui et al. | |
| 2007/0090365 A1 | 4/2007 | Hayashi et al. | |
| 2007/0103961 A1 * | 5/2007 | Roper | G11C 11/22 365/145 |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0205799 A1 * | 9/2007 | Von Thun | 326/14 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0130380 A1 * | 6/2008 | Wang et al. | 365/189.16 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0315862 A1 * | 12/2010 | Huang | G11C 11/419 365/156 |
| 2011/0101351 A1 | 5/2011 | Yamazaki | |
| 2011/0121878 A1 * | 5/2011 | Kato | G11C 7/04 327/215 |
| 2011/0148463 A1 * | 6/2011 | Kato et al. | 326/47 |
| 2012/0182788 A1 * | 7/2012 | Kurokawa | H01L 21/84 365/149 |
| 2012/0307550 A1 * | 12/2012 | Yu et al. | 365/156 |
| 2013/0069052 A1 * | 3/2013 | Sandhu | H01L 21/8254 257/43 |
| 2015/0228324 A1 * | 8/2015 | Aoki | G11C 11/34 365/174 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-192484 A | 7/1995 |
| JP | 08-264794 A | 10/1996 |
| JP | 11-505377 | 5/1999 |

(56) References Cited

FOREIGN PATENT DOCUMENTS

| JP | 2000-044236 A | 2/2000 |
|----|---------------|--------|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-109309 A | 4/2007 |
| JP | 2011-171702 A | 9/2011 |
| JP | 2012-065042 A | 3/2012 |
| KR | 1996-0008823 | 7/1996 |
| WO | WO-2004/114391 | 12/2004 |
| WO | WO-2011/052396 A1 | 5/2011 |

OTHER PUBLICATIONS

Written Opinion (Application No. PCT/JP2014/060887) Dated Jul. 1, 2014.

Ishii.T et al., "A Poly-Silicon TFT With a Sub-5-nm Thick Channel for Low-Power Gain Cell Memory in Mobile Applications," IEEE Transaction on Electron Devices, Nov. 1, 2004, vol. 51, No. 11, pp. 1805-1810.

Kim.W et al., "An Experimental High-Density DRAM Cell with a Built-in Gain Stage," IEEE Journal of Solid-State Circuits, Aug. 1, 1994, vol. 29, No. 8, pp. 978-981.

Shukuri.S et al., "A Complementary Gain Cell Technology for Sub-1 V Supply DRAMs," IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Chun.K et al., "A 3T Gain Cell Embedded DRAM Utilizing Preferential Boosting for High Density and Low Power On-Die Caches,"IEEE Journal of Solid-State Circuits, Jun. 1, 2011, vol. 46, No. 6, pp. 1495-1505.

Eslami.F et al., "Capacitive Boosting for FPGA Interconnection Networks," 21st International Conference on Field Programmable Logic and Applications, 2011, vol. 21, pp. 453-458.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of polysilicon Thin-Film Transistors", IEEE Transactions on Electron Devices, Jul. 1, 1995, vol. 42, No. 7, pp. 1240-1246.

Cho.D et al., "21.2AL and Sn-Doped Zinc Indium Oxide Thin Film Transistors for AMOLED Back-Plane", SID Digest '09 : SID International Symposium Digest of Technical Papers, May 31, 2009, pp. 280-283.

Clarks et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digeset of Technical Papers, May 20, 2008, vol. 39, pp. 621-624.

Hirao.T et al., "Novel Top-Gate Zinc Oxide Thin-Film Transistors (ZnO TFTS) for AMLCDS", Journal of the SID, 2007, vol. 15, No. 1, pp. 17-22.

Hosono.H et al., "Working hypothesis to explore novel wide band gap electrically conducting amorphous oxides and examples"J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2008, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending properties"SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C,", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3-ZnGa2O3(ZnO)m (m=3, 4, and 5), InGaO3(ZnO)3, and Ga2O3(ZnO)m (M=7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using Single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor"Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-2783.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J at al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-IN. AMOLED Display With Driver Circuit Using Amorphous In—Ga—Zn-Oxide TFTS", IDW '09 : Proceesings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

LOW POWER STORAGE DEVICE IN WHICH OPERATION SPEED IS MAINTAINED

TECHNICAL FIELD

One embodiment of the present invention relates to semiconductor devices. For example, one embodiment of the present invention relates to storage devices and semiconductor devices including the storage devices.

BACKGROUND ART

A metal oxide having semiconductor characteristics called an oxide semiconductor has attracted attention as a novel semiconductor. Transistors including oxide semiconductors are under development. For example, Patent Document 1 discloses the structure of a memory element for retaining data in a node that becomes floating by turning off such a transistor.

REFERENCE

Patent Document 1: Japanese Published Patent Application No. 2011-171702

DISCLOSURE OF INVENTION

To evaluate the performance of a semiconductor device such as a storage device, low power consumption and high-speed operation are important factors. However, when power supply voltage is decreased to reduce the power consumption of the storage device, the on-state current of a transistor is decreased, so that the operation speed of the storage device is also decreased. In other words, there is a tradeoff between a reduction in power consumption and an increase in operation speed. In view of the operation speed, it is impossible to decrease power supply voltage only for reducing power consumption.

A high-level potential applied to a node in a memory cell of a storage device through an n-channel transistor is decreased by the threshold voltage of the transistor. Thus, when the power supply voltage of the storage device is decreased to reduce power consumption, the potential of the node in the memory cell of the storage device becomes too low, so that the logic level of a signal output from the memory cell is changed. Consequently, data reliability is likely to be decreased.

In view of the above technical background, it is an object of one embodiment of the present invention to provide a low-power storage device in which operation speed can be maintained. Alternatively, it is an object of one embodiment of the present invention to provide a low-power storage device that can operate correctly. Alternatively, it is an object of one embodiment of the present invention to provide a low-power semiconductor device in which operation speed can be maintained. Alternatively, it is an object of one embodiment of the present invention to provide a low-power semiconductor device that can operate correctly.

In one embodiment of the present invention, data is written to a storage device by accumulating electric charge in a node through a first transistor. Supply of a first signal to a gate of the first transistor is controlled by a second transistor. The first transistor is turned on or off in accordance with the potential of the first signal.

In addition, in one embodiment of the present invention, when data is written to the storage device, the potential of a second signal including the data is input to a logic element having low current supply capability, and a potential output from the logic element is supplied to one of a source and a drain of the first transistor. With such a structure, when the potential of the second signal including the data is changed from a first potential into a second potential that is lower than the first potential, the potential of one of the source and the drain of the first transistor can be changed from a third potential that is lower than the second potential into the first potential after the potential of one of the source and the drain of the first transistor is changed from the second potential into the third potential.

Furthermore, when data is written to the storage device, a potential that is higher than a potential obtained by addition of the threshold voltage of the second transistor to the second potential is supplied to a gate of the second transistor. When the potential of one of the source and the drain of the first transistor is decreased from the second potential to the third potential in a state where the potential is supplied to the gate of the second transistor, the second transistor is on; thus, the potential of the first signal is supplied to the gate of the first transistor through the second transistor. When the potential of one of the source and the drain of the first transistor is increased from the third potential to the first potential in a state where the potential is supplied to the gate of the second transistor, the second transistor is turned off; thus, the gate of the first transistor becomes floating. With the increase in potential of one of the source and the drain of the first transistor from the third potential into the first potential, because of capacitance Cs formed between the source and the gate of the first transistor, the potential of the gate of the first transistor is also increased.

Thus, in the case where the potential of the first signal is high, the potential of the gate of the first transistor can be increased by the above operation even when the potential of the gate of the first transistor is decreased from the potential by the threshold voltage of the second transistor. Accordingly, the first transistor can be turned on reliably. Consequently, in the storage device according to one embodiment of the present invention, data can be written to the node at high speed even when power supply voltage supplied to the storage device is decreased, and it is possible to prevent a potential supplied to the node in data writing from being decreased by the threshold voltage of the first transistor.

Specifically, a storage device according to one embodiment of the present invention includes a first transistor, a second transistor, a logic element, and a semiconductor element. The second transistor controls supply of a first signal to a gate of the first transistor. When the potential of a second signal to be input is changed from a first potential into a second potential that is lower than the first potential, the logic element changes the potential of one of a source and a drain of the first transistor from a third potential that is lower than the second potential into the first potential after the logic element changes the potential of one of the source and the drain of the first transistor from the second potential into the third potential. The semiconductor element has a function of making the other of the source and the drain of the first transistor floating.

The first transistor has lower off-state current than a transistor including a channel formation region in a silicon film or a silicon substrate. A transistor including a channel formation region in a film of a semiconductor having a wider band gap and lower intrinsic carrier density than silicon can have significantly lower off-state current than a transistor including a channel formation region in a normal semiconductor such as silicon or germanium. Thus, such a transistor is suitable for the first transistor. Examples of a semiconductor having a wider band gap and lower intrinsic carrier density than silicon are an oxide semiconductor, silicon carbide, and gallium nitride whose bandgap is 2 or more times that of silicon.

With such a structure, the node becomes floating, i.e., has extremely high insulating properties with another electrode or a wiring when the first transistor is off. Thus, the potential of the signal including the data is held in the node.

According to one embodiment of the present invention, it is possible to provide a low-power storage device in which operation speed can be maintained. Alternatively, according to one embodiment of the present invention, it is possible to provide a low-power storage device that can operate correctly. Alternatively, according to one embodiment of the present invention, it is possible to provide a low-power semiconductor device in which operation speed can be maintained. Alternatively, according to one embodiment of the present invention, it is possible to provide a low-power semiconductor device that can operate correctly.

BRIEF DESCRIPTION OF DRAWINGS

In the accompanying drawings.

BEST MODE FOR CARRYING OUT THE INVENTION

An embodiment of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiment.

Note that a semiconductor device according to one embodiment of the present invention includes, in its category, a variety of semiconductor integrated circuits formed using semiconductor elements, such as microprocessors, image processing circuits, controllers for semiconductor display devices, digital signal processors (DSP), microcontrollers, control circuits for batteries such as secondary batteries, and protection circuits. The semiconductor device according to one embodiment of the present invention includes, in its category, a variety of devices such as RF tags formed using any of the semiconductor integrated circuits and semiconductor display devices. The semiconductor display device includes, in its category, liquid crystal display devices, light-emitting devices in which a light-emitting element typified by an organic light-emitting element is provided in each pixel, electronic paper, digital micromirror devices (DMD), plasma display panels (PDP), field emission displays (FED), and other semiconductor display devices in which semiconductor elements are included in driver circuits.

<Structure Example 1 of Storage Device>

Figure 1:
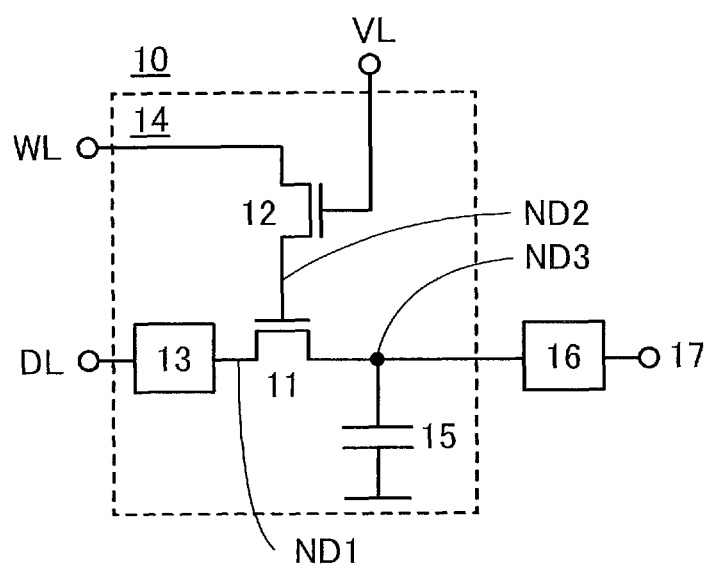
FIG. 1 illustrates a storage device structure.

First, a structure example of a storage device according to one embodiment of the present invention is described. FIG. 1 illustrates the structure of a storage device 10 according to one embodiment of the present invention.

The storage device 10 according to one embodiment of the present invention includes one or more groups each including at least a transistor 11, a transistor 12, and a logic element 13. FIG. 1 illustrates a structure example of the storage device 10 that includes one memory cell 14 as the group.

The storage device 10 in FIG. 1 further includes a semiconductor element 16 supplied with a potential output from the memory cell 14. A potential output from the semiconductor element 16 is applied to a wiring 17. Note that in the structure of the storage device 10 in FIG. 1, the semiconductor element 16 is not included in the memory cell 14; however, the semiconductor element 16 may be included in the memory cell 14.

The transistor 11 has a function of controlling the electrical connection between a node ND1 and a node ND3 in the memory cell 14 in accordance with the potential of a node ND2. Specifically, one of a source and a drain of the transistor 11 corresponds to the node ND1, the other of the source and the drain of the transistor 11 corresponds to the node ND3, and a gate of the transistor 11 corresponds to the node ND2. The potential of a signal including data that is output from the logic element 13 is supplied to the node ND1. When the potential is supplied to the node ND3 through the transistor 11, electric charge corresponding to the potential is accumulated in the node ND3 and data is written to the memory cell 14.

In FIG. 1, the memory cell 14 includes a capacitor 15 connected to the node ND3, and the potential of the node ND3 is held by the capacitor 15.

Note that in this specification, the term "connection" means an electrical connection and corresponds to a state where current, voltage, or a potential can be supplied or transmitted. Accordingly, a connection state does not always mean a direct connection state but includes an electrical connection state through a circuit element such as a wiring, a resistor, a diode, or a transistor so that current, voltage, or a potential can be supplied or transmitted.

A source of a transistor means a source region that is part of a semiconductor film functioning as an active layer or a source electrode that is electrically connected to the semiconductor film. Similarly, a drain of a transistor means a drain region that is part of a semiconductor film functioning as an active layer or a drain electrode that is electrically connected to the semiconductor film. A gate means a gate electrode.

The terms "source" and "drain" of a transistor interchange with each other depending on the conductivity type of the transistor or levels of potentials applied to terminals. In general, in an n-channel transistor, a terminal to which a low potential is applied is called a source, and a terminal to which a high potential is applied is called a drain. Furthermore, in a p-channel transistor, a terminal to which a low potential is applied is called a drain, and a terminal to which a high potential is applied is called a source. In this specification, although the connection relationship of the transistor is described assuming that the source and the drain are fixed in some cases for convenience, actually, the names of the source and the drain interchange with each other depending on the relationship of the potentials.

In one embodiment of the present invention, the transistor 11 has extremely low off-state current. A transistor including a channel formation region in a film of a semiconductor having a wider band gap and lower intrinsic carrier density than silicon can have significantly lower off-state current than a transistor including a channel formation region in a normal semiconductor such as silicon or germanium. Thus, such a transistor is suitable for the transistor 11. Examples of such a semiconductor are an oxide semiconductor and gallium nitride whose bandgap is 2 or more times that of silicon.

Since the off-state current of the transistor 11 is extremely low, the other of the source and the drain of the transistor 11 becomes floating, i.e., has extremely high insulating properties with another electrode or a wiring when the transistor 11 is off. Accordingly, electric charge held in the node ND3 can be prevented from leaking, and the potential of the signal including data is held in the node ND3.

Note that unless otherwise specified, off-state current in this specification means current that flows in a cut-off region between a source and a drain of a transistor.

The transistor 12 has a function of controlling supply of a signal from a wiring WL to the gate of the transistor 11, i.e., the node ND2. Thus, the transistor 11 is turned on or off in accordance with the potential of the signal. Specifically, one of a source and a drain of the transistor 12 is connected to the wiring WL supplied with the signal, the other of the source and the drain of the transistor 12 is connected to the gate of the transistor 11, and a gate of the transistor 12 is connected to a wiring VL.

The semiconductor element 16 has a function of making the other of the source and the drain of the transistor 11, i.e., the node ND3 floating. Specifically, a transistor, a capacitor, or the like can be used as the semiconductor element 16. For example, in the case where a transistor is used as the semiconductor element 16, a gate of the transistor is connected to the node ND3. For example, in the case where a capacitor is used as the semiconductor element 16, one of a pair of electrodes of the capacitor is connected to the node ND3.

The logic element 13 has functions of inverting the polarity of the potential of the signal including data after the signal is input and supplying the inverted signal to one of the source and the drain of the transistor 11, i.e., the node ND1. For example, an inverter or the like can be used as the logic element 13. Furthermore, the logic element 13 preferably has low current supply capability. Specifically, the logic element 13 preferably has low current supply capability such that when the potential of a signal input to the logic element 13 is changed from a first potential into a second potential that is lower than the first potential, the potential of the node ND1 is changed from a third potential that is lower than the second potential into the first potential after the potential of the node ND1 is changed from the second potential into the third potential.

Specifically, an input terminal of the logic element 13 is connected to a wiring DL, and an output terminal of the logic element 13 is connected to one of the source and the drain of the transistor 11, i.e., the node ND1.

<Operation Example of Storage Device>

Figure 2A:
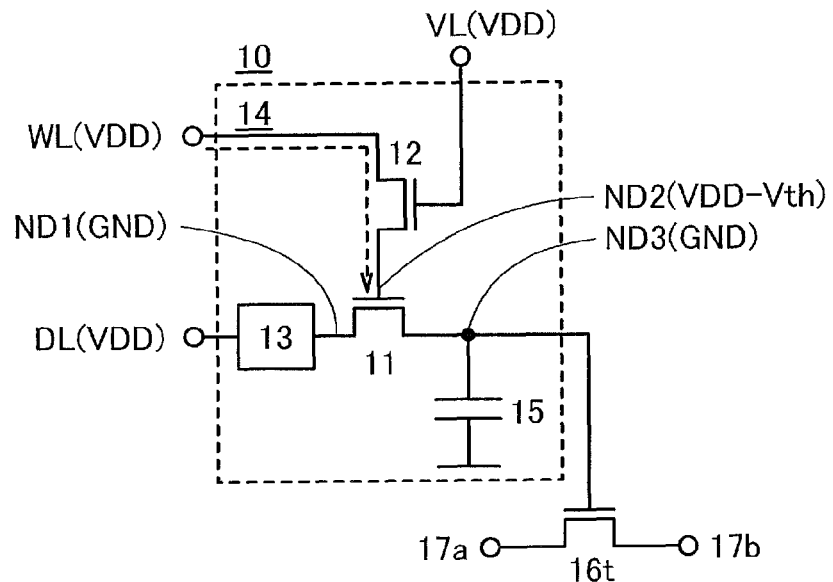
FIGS. 2A and 2B illustrate storage device operation.
Figure 2B:
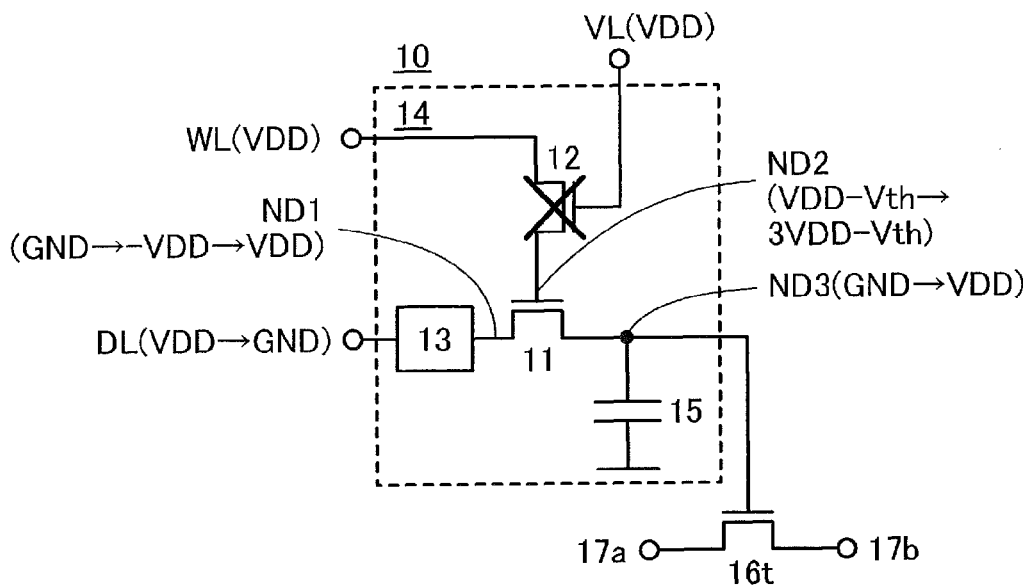
Figure 3:
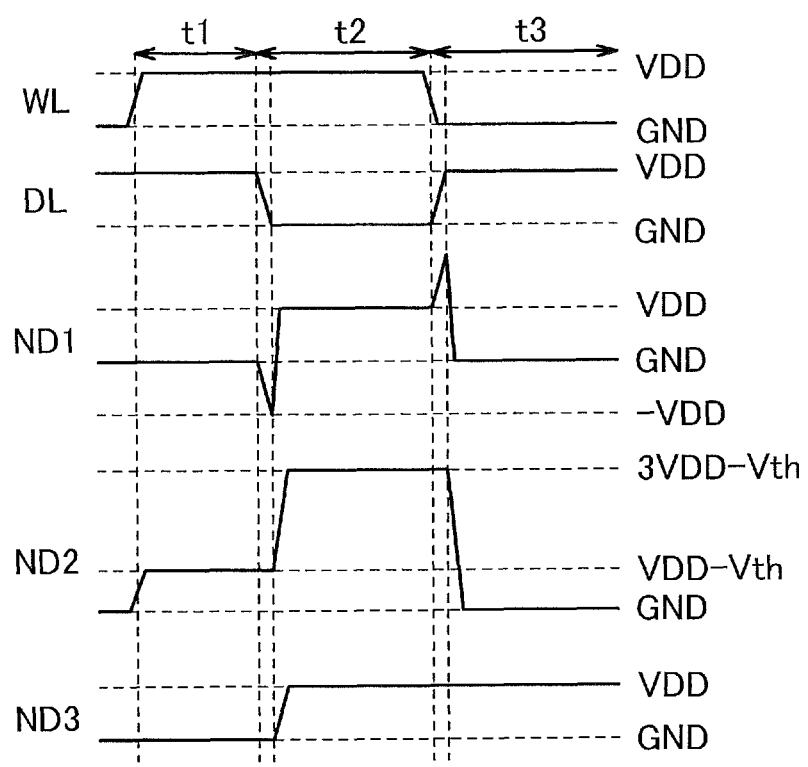
FIG. 3 is a timing chart of a storage device.

Next, an operation example of the storage device 10 in FIG. 1 is described. FIGS. 2A and 2B schematically illustrate the operation example of the storage device 10 in FIG. 1. Note that in FIGS. 2A and 2B, an n-channel transistor 16t is used as the semiconductor element 16 and the node ND3 is connected to a gate of the transistor 16t. In FIGS. 2A and 2B, one of a source and a drain of the transistor 16t is connected to a wiring 17a (example of the wiring 17), and the other of the source and the drain of the transistor 16t is connected to a wiring 17b (example of the wiring 17). FIG. 3 is an example of a timing chart showing potentials of the wiring WL, the wiring DL, the node ND1, the node ND2, and the node ND3.

First, as illustrated in FIG. 2A, in a period t1, a high-level potential (VDD) is supplied to the wiring WL. In addition, a high-level potential (e.g., VDD) that is higher than a potential obtained by addition of the threshold voltage of the transistor 12 to a low-level potential (e.g., a ground potential GND) is supplied to the wiring VL. Thus, the transistor 12 is on, so that a potential (VDD−Vth) obtained by subtraction of the threshold voltage Vth of the transistor 12 from the high-level potential (VDD) is supplied to the gate of the transistor 11, i.e., the node ND2 through the transistor 12.

Then, the high-level potential (VDD) is supplied to the wiring DL, so that the low-level potential (GND) is supplied from the logic element 13 to one of the source and the drain of the transistor 11, i.e., the node ND1. Thus, the low-level potential (GND) is applied to the node ND3 through the transistor 11. Thus, in the period t1, the transistor 16t can be turned off and the wiring 17a can be electrically isolated from the wiring 17b.

Next, as illustrated in FIG. 2B, at the beginning of a period t2, a potential supplied to the wiring DL is decreased from the high-level potential (VDD) to the low-level potential (GND). Since the logic element 13 has low current supply capability, with the decrease in potential supplied to the wiring DL, the potential of the node ND1 is decreased because of capacitance between the input terminal and the output terminal of the logic element 13. In FIG. 2B and FIG. 3, the potential of the node ND1 is decreased from the low-level potential (GND) to a lower-level potential (−VDD).

In addition, in the period t2, the high-level potential (VDD) is supplied to the wiring WL and the high-level potential (VDD) is continuously supplied to the wiring VL. Thus, the transistor 12 is on at the beginning of the period t2, so that the potential (VDD−Vth) is continuously supplied to the gate of the transistor 11, i.e., the node ND2.

Then, in the period t2, as illustrated in FIG. 2B, the logic element 13 increases the potential of the node ND1 from the low-level potential (−VDD) to the high-level potential (VDD). With the increase in potential of the node ND1, the potential of the gate of the transistor 11, i.e., the node ND2 is started to be increased because of the capacitance Cs formed between the source and the gate of the transistor 11. Thus, the potential of the other of the source and the drain of the transistor 12 that is connected to the node ND2 becomes higher than the potential (VDD−Vth), so that the transistor 12 is turned off. Consequently, the gate of the transistor 11, i.e., the node ND2 becomes floating.

Even after the node ND2 becomes floating, the potential of the node ND2 is continuously increased. Ideally, the potential of the node ND2 is increased to a potential (3VDD−Vth) obtained by addition of a difference between the low-level potential (−VDD) and the high-level potential (VDD) to the potential (VDD−Vth). In other words, in one embodiment of the present invention, at the end of the period t1, even when the gate potential of the transistor 11 is decreased from the high-level potential (VDD) by the threshold voltage Vth of the transistor 12, the gate potential of the transistor 11 can be increased by the above operation in the period t2. Consequently, in the storage device 10 according to one embodiment of the present invention, even when power supply voltage supplied to the storage device 10 is decreased and a difference between the potential (VDD) and the potential (GND) is decreased, the potential (VDD) supplied to the node ND1 in data writing can be prevented from being decreased by the threshold voltage of the transistor 11, the potential (VDD) can be supplied to the node ND3, and data can be written to the node ND3 at high speed.

Since the high-level potential (VDD) is supplied to the node ND3 in the period t2, the transistor 16t is turned on and the wiring 17a is electrically connected to the wiring 17b.

Note that in FIG. 2B and FIG. 3, in the period t2, the potential supplied to the wiring DL is decreased from the high-level potential (VDD) to the low-level potential (GND), and the high-level potential (VDD) corresponding to a logical value "1" is supplied to the node ND3. However, in one embodiment of the present invention, in the period t2, the potential supplied to the wiring DL can be kept at the high-level potential (VDD), and the low-level potential (GND) corresponding to a logical value "0" can be supplied to the node ND3.

Then, in a period t3, the low-level potential (GND) is supplied to the wiring WL. The high-level potential (e.g., VDD) is supplied to the wiring VL. Thus, the transistor 12 is on, so that the low-level potential (GND) is supplied to the gate of the transistor 11, i.e., the node ND2 through the transistor 12. Accordingly, the transistor 11 is turned off and the potential (VDD) supplied in the period t2 is held in the node ND3. Consequently, the transistor 16t is kept on and the wiring 17a is kept electrically connected to the wiring 17b.

Furthermore, since the high-level potential (VDD) is supplied to the wiring DL in the period t3, the node ND1 has the potential (GND).

<Structure Example of Logic Element>

Figure 4A:
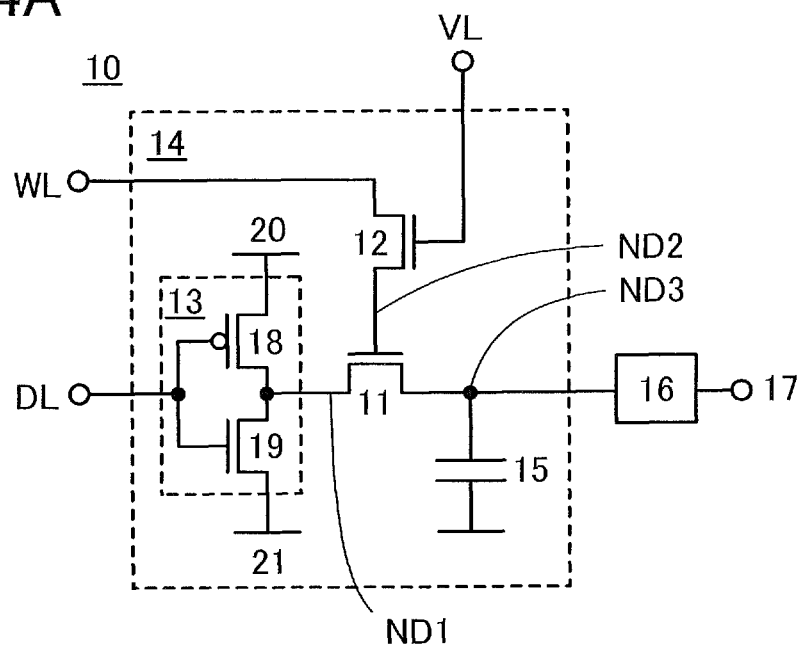
FIGS. 4A and 4B each illustrate a storage device structure.

Next, FIG. 4A illustrates the structure of the storage device 10 that includes an inverter as the logic element 13.

The logic element 13 included in the storage device 10 in FIG. 4A includes a p-channel transistor 18 and an n-channel transistor 19. Gates of the transistors 18 and 19 are connected to the wiring DL. One of a source and a drain of the transistor 18 is connected to a wiring 20 supplied with a high-level potential, and one of a source and a drain of the transistor 19 is connected to a wiring 21 supplied with a low-level potential. The other of the source and the drain of the transistor 18 and the other of the source and the drain of the transistor 19 are connected to one of the source and the drain of the transistor 11, i.e., the node ND1.

Figure 4B:
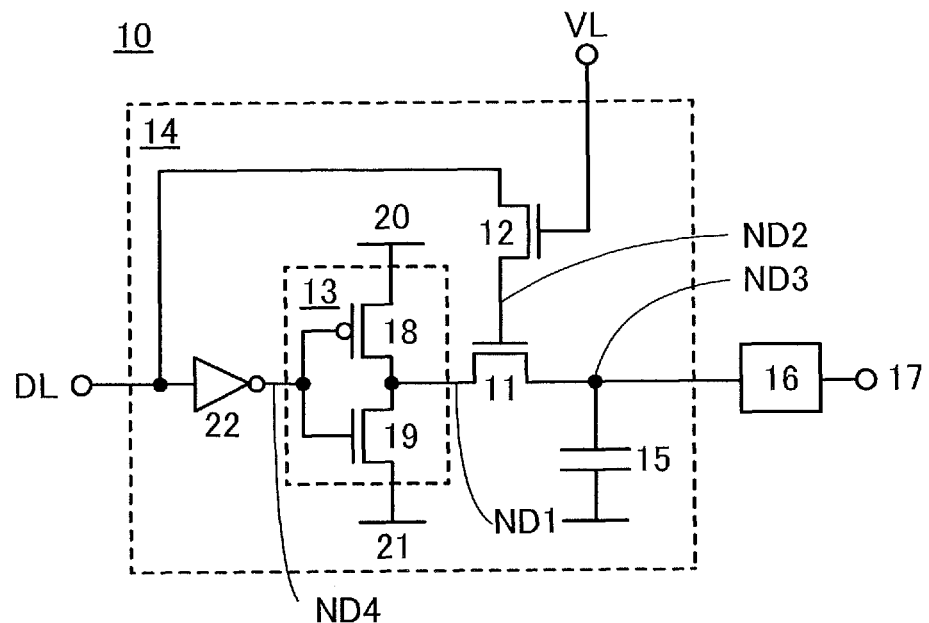

FIG. 4B illustrates another structure example of the storage device 10 that includes an inverter as the logic element 13. The storage device 10 in FIG. 4B is obtained by addition of an inverter 22 to the storage device 10 in FIG. 4A. Specifically, in the storage device 10 in FIG. 4B, the wiring WL is connected to the wiring DL, and the wiring DL is connected to an input terminal of the inverter 22 and one of the source and the drain of the transistor 12. Note that FIG. 4B does not illustrate the wiring WL but illustrates only the wiring DL. In addition, an output terminal of the inverter 22 is connected to the input terminal (node ND4) of the logic element 13.

Note that in FIGS. 4A and 4B, when a data retention period becomes longer, a potential between a high-level potential and a low-level potential is applied to the semiconductor element 16 for a long time in some cases. Thus, for example, in the case where an inverter is used as the semiconductor element 16, it is preferable to reduce the power consumption of the inverter by increasing the channel length of the transistor included in the inverter.

Note that in the storage device 10 according to one embodiment of the present invention, the logic element 13 preferably has low current supply capability such that when the potential of a signal input to the logic element 13 is changed from a first potential into a second potential that is lower than the first potential, the potential of the node ND1 is changed from a third potential that is lower than the second potential into the first potential after the potential of the node ND1 is changed from the second potential into the third potential. Specifically, in FIGS. 4A and 4B, the channel length of each of the transistors 18 and 19 is preferably large. Specific channel length is described below. Note that in the following description, for easy understanding, the source of the transistor 18 is connected to the wiring 20, the source of the transistor 19 is connected to the wiring 21, and the drains of the transistors 18 and 19 are connected to the node ND1.

In the storage device 10 in FIG. 4B, in transition of the potential of the input terminal of the logic element 13, i.e., the node ND4 that is decreased from the high-level potential (VDD) to the low-level potential (e.g., the ground potential GND), a channel formation region is formed in each of the transistors 18 and 19 included in the logic element 13. Note that the channel formation region means a region of a semiconductor film of a transistor or a semiconductor substrate that overlaps with a gate electrode and is sandwiched between a source electrode or a source region and a drain region or a drain electrode. In addition, if the half of capacitance between the gate electrode and the channel formation region is the capacitance Cs between the gate electrode and the source region and the other half of the capacitance between the gate electrode and the channel formation region is capacitance Cd between the gate electrode and the drain region, the capacitance Cs and the capacitance Cd are represented by Equation (1). The channel length and the channel width of the transistor 19 are denoted by Li and Wn, respectively. The channel length and the channel width of the transistor 18 are denoted by Li and Wp, respectively. A proportional constant is denoted by α.

$$Cs = Cd \qquad (1)$$
$$= \frac{\alpha \, Li \, (Wn + Wp)}{2}$$

A fixed potential is applied to each of the wiring 20 connected to the source of the transistor 18 and the wiring 21 connected to the source of the transistor 19. If the channel formation region of the transistor 11 has high resistance and the transistor 12 is off when the potential of the input terminal of the logic element 13 is decreased from the high-level potential (VDD) to the low-level potential (GND), the drain of the transistor 18 and the drain of the transistor 19 can be regarded as being floating.

If sink current supplied from the output terminal of the inverter 22 to the input terminal of the logic element 13 is denoted by Is, the capacitance Cs of the logic element 13 is charged by the sink current Is; thus, the falling time constant τi of the potential of the input terminal of the logic element 13 is represented by Equation (2).

$$\tau i = Cs \cdot \frac{VDD}{Is} \qquad (2)$$

$$= \frac{a\ Li\ (Wn+Wp)}{2} \cdot \frac{VDD}{Is}$$

The channel length and the channel width of each transistor included in the inverter 22 are denoted by L and W, respectively. In general, the minimum channel length and the minimum channel width that are determined by a process are used as the channel length L and the channel width W, respectively. The channel width Wn of the transistor 19 in the logic element 13 is equal to the channel width W. The channel width Wp of the transistor 18 is adjusted so that the same drain current flows through the transistors 18 and 19 in consideration of a mobility difference between the p-channel transistor 18 and the n-channel transistor 19.

If the potential of the node ND1 is decreased to the potential (−VDD) when the potential of the input terminal of the logic element 13 is decreased from the high-level potential (VDD) to the low-level potential (GND), current Ii flows to the transistors 18 and 19 in the logic element 13. The current Ii can be represented by Equation (3).

$$Ii = 2\ Is\ \frac{L}{Li} \quad (3)$$

The capacitance Cd of the logic element 13 is charged by the current Ii flowing to the transistors 18 and 19 in the logic element 13; thus, the rising time constant τo of the potential in the node ND1 is represented by Equation (4).

$$\tau o = Cd \cdot \frac{VDD}{Ii} \quad (4)$$
$$= \frac{a\ Li\ (Wn+Wp)}{2} \cdot \frac{VDD}{2\ Is\ L}$$

In one embodiment of the present invention, the logic element 13 preferably has low current supply capability. To achieve this, the time constant τo is preferably larger than the time constant τi. In other words, to meet the above condition, it is necessary to satisfy Equation (5) derived from Equation (2) and Equation (4).

$$\frac{a\ Li\ (Wn+Wp)}{2} \cdot \frac{Li\ VDD}{2\ Is\ L} > \frac{a\ Li\ (Wn+Wp)}{2} \cdot \frac{VDD}{Is} \quad (5)$$

Equation (6) can be derived from Equation (5).

$$Li > 2L \quad (6)$$

Thus, in one embodiment of the present invention, the channel length Li of the transistor included in the logic element 13 is preferably more than twice the channel length L of the transistor included in the inverter 22.

In the case of FIG. 4A, if the parasitic resistance and the parasitic capacitance of the wiring DL are denoted by Rp and Cp, respectively, the falling time constant τi of the potential of the input terminal of the logic element 13 is represented by Equation (7).

$$\tau i = Cp \cdot Rp \quad (7)$$

Furthermore, as in the case of FIG. 4B, the rising time constant τo of the potential in the node ND1 in the case of FIG. 4A is represented by Equation (4). To meet the condition that the time constant τo is larger than the time constant τi, it is necessary to satisfy Equation (8).

$$\frac{a\ Li\ (Wn+Wp)}{2} \cdot \frac{Li\ VDD}{2\ Is\ L} > Cp \cdot Rp \quad (8)$$

Equation (9) can be derived from Equation (8).

$$Li > \frac{4\ Is\ Cp\ Rp}{a\ Li\ (Wn+Wp)\ VDD} L \quad (9)$$

Thus, in the case of FIG. 4A, the channel length L of the transistor included in the logic element 13 is preferably significantly larger than the channel length L of another transistor such that Equation (9) is satisfied.

Figure 13:
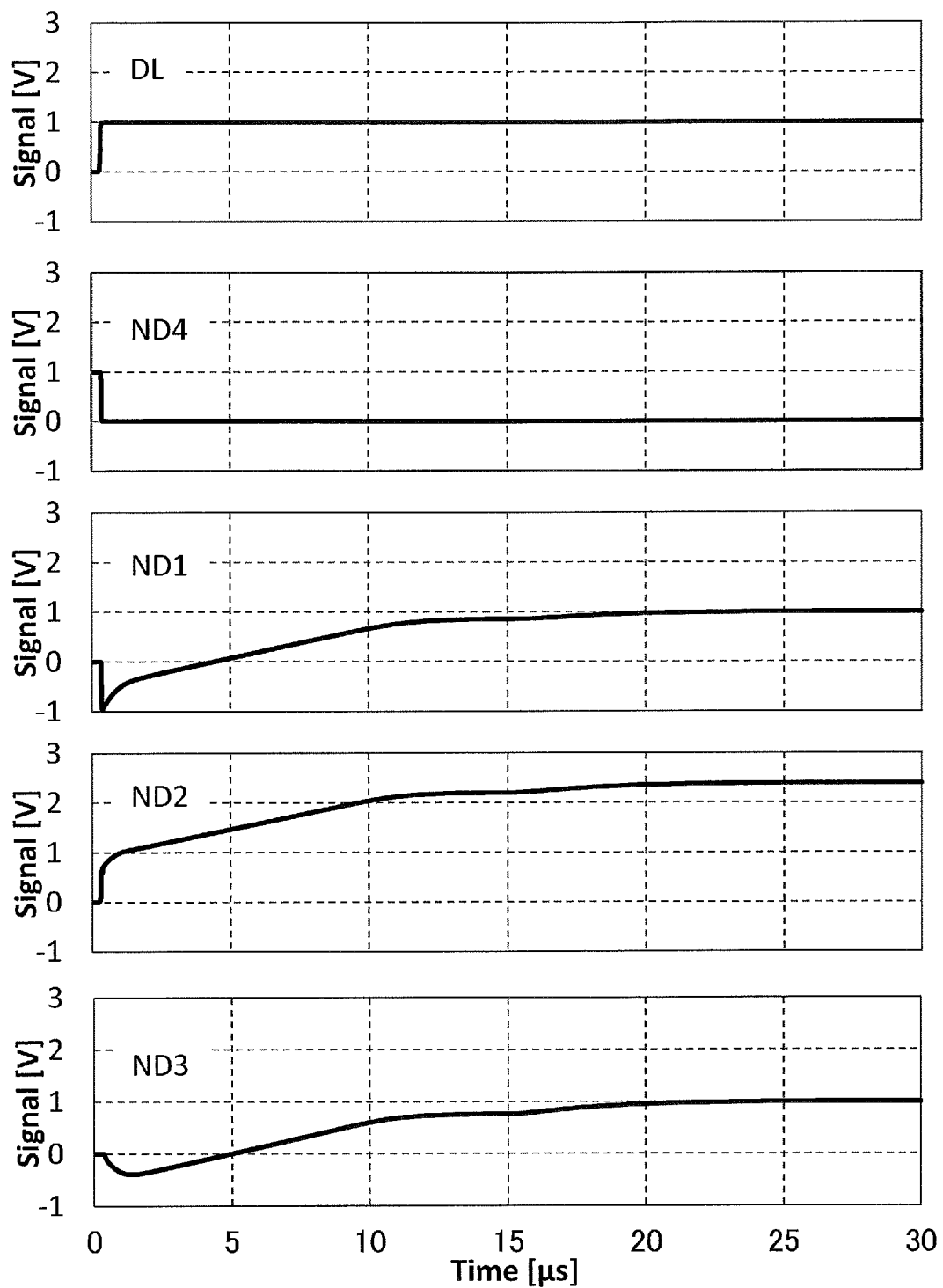
FIG. 13 shows potential waveforms obtained by calculation.

Next, FIG. 13 shows potential waveforms of wirings and nodes in the storage device 10 in FIG. 4B that are obtained by calculation. The calculation was conducted under a condition that a low-level potential and a high-level potential were 0 V and 1 V, respectively.

When the potential of the wiring DL was increased from 0 V to 1 V, the potential of the input terminal of the logic element 13 (inverter), i.e., the node ND4 was decreased from 1 V to 0 V. In the case of an inverter having sufficiently high current supply capability, when 0 V is supplied to an input terminal, 1 V is output from an output terminal; however, the logic element 13 has low current supply capability. Accordingly, when the potential of the node ND4 was decreased, the potential of the node ND1 was temporarily decreased from 0 V to approximately −1 V because of capacitance between the input terminal and the output terminal of the logic element 13, and then, was increased to 1 V over time.

With the increase in potential of the wiring DL from 0 V to 1 V, the potential of the node ND2 was started to be increased. Then, when the gate voltage of the transistor 12 became close to the threshold voltage, the drain current of the transistor 12 was decreased, and the potential of the node ND2 stopped increasing after it became approximately 0.6 to 0.7 V without reaching 1 V. After the potential of the node ND2 reached the above potential, the potential of the node ND1 was decreased from 0 V to approximately −1 V. At that time, the potential of the node ND2 was almost decreased because of the capacitance Cs of the transistor 11; however, the potential of the node ND2 was hardly decreased because 1 V was supplied from the wiring DL to the node ND2 through the transistor 12.

Then, when the potential of the node ND1 was increased from approximately −1 V to 1 V, the transistor 12 was turned off; thus, the potential of the node ND2 was increased to higher than 2 V because of the capacitance Cs of the transistor 11. Since the potential of the node ND2 was sufficiently increased, it was confirmed that a desired potential 1 V was able to be written to the node ND3 without a decrease in potential of the node ND3 by the threshold voltage of the transistor 11.

If the logic element 13 has sufficiently high current supply capability and the potential of the node ND1 is increased from 0 V to 1 V without a temporal decrease, the potential of the node ND2 is not increased to higher than 2 V though it might be increased to higher than 1 V because of the capacitance Cs of the transistor 11. On the other hand, in one embodiment of the present invention, since the potential of the output terminal of the logic element 13 is increased after it is decreased temporarily, the potential of the node ND2, i.e., the gate potential of the transistor 11 can be high compared with the case where the logic element 13 has sufficiently high current supply capability. Consequently, it is possible to write a desired potential to the node ND3 in the memory cell 14 without an increase in the number of power supply potentials.

<Structure Example 2 of Storage Device>

Then, examples of the structure of a storage device including a plurality of memory cells and a method for driving the storage device are described.

Figure 5:
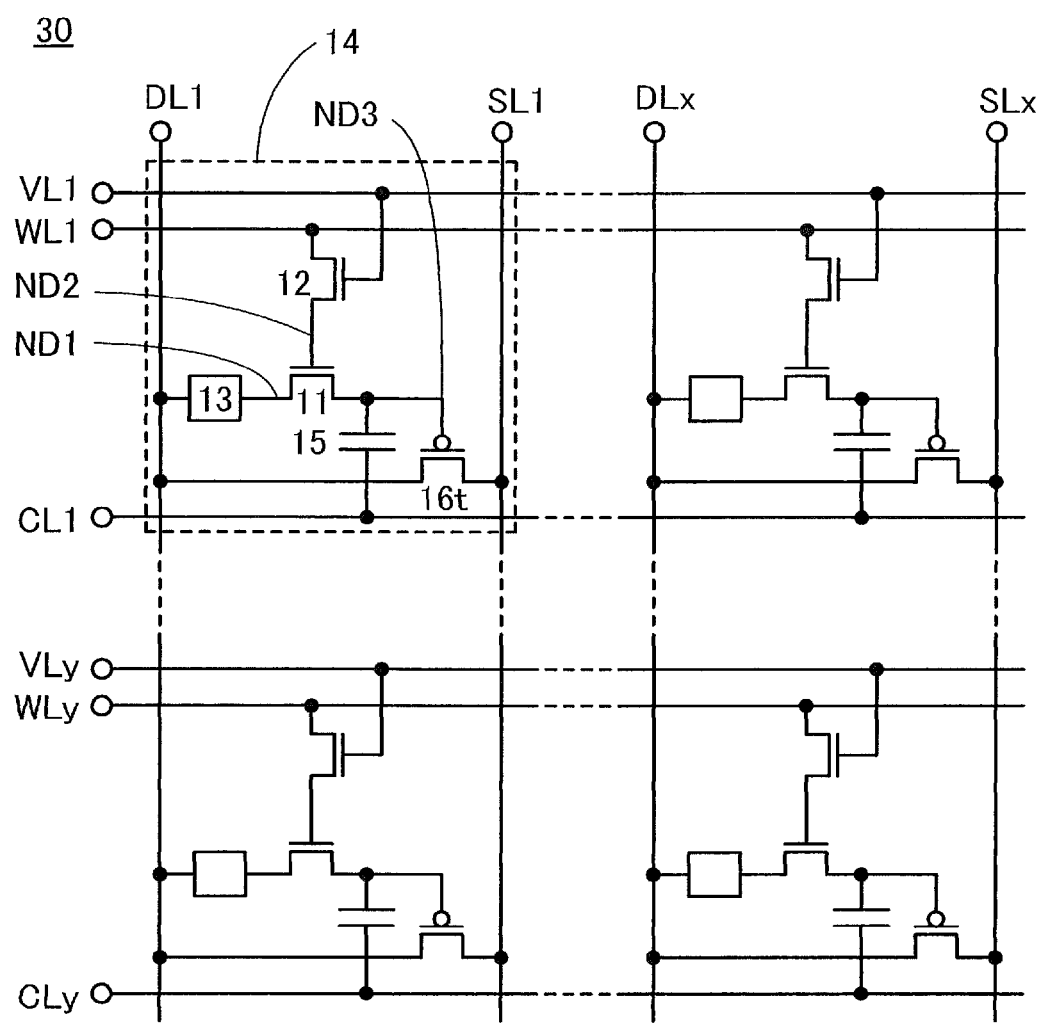
FIG. 5 illustrates a cell array structure.

FIG. 5 is an example of a circuit diagram of a cell array 30 including the plurality of memory cells 14. Unlike FIG. 1, FIG. 5 illustrates the case where the semiconductor element 16 is included in the memory cell 14 and a transistor 16t is used as the semiconductor element 16.

In the cell array 30 in FIG. 5, a variety of wirings such as the plurality of wirings WL, the plurality of wirings DL, the plurality of wirings VL, a plurality of wirings CL, and a plurality of wirings SL are provided, and a signal or a potential from a driver circuit is supplied to each memory cell 14 through the wirings.

Note that the number of wirings can be determined by the number and arrangement of the memory cells 14. Specifically, in the case of the cell array 30 in FIG. 5, the memory cells 14 in y rows and x columns (each of x and y is a natural number of 2 or more) are connected in matrix, and wirings WL1 to WLy corresponding to the plurality of wirings WL, wirings DL1 to DLx corresponding to the plurality of wirings DL, wirings VL1 to VLy corresponding to the plurality of wirings VL, wirings CL1 to CLy corresponding to the plurality of wirings CL, and wirings SL1 to SLy corresponding to the plurality of wirings SL are provided in the cell array 30.

In each of the memory cells 14, the input terminal of the logic element 13 is connected to one of the wirings DL, and the output terminal of the logic element 13 is connected to one of the source and the drain of the transistor 11. The gate of the transistor 12 is connected to one of the wirings VL, one of the source and the drain of the transistor 12 is connected to the wiring WL, and the other of the source and the drain of the transistor 12 is connected to the gate of the transistor 11. The other of the source and the drain of the transistor 11 is connected to the gate of the transistor 16t and one electrode of the capacitor 15. The other electrode of the capacitor 15 is connected to one of the wirings CL. One of the source and the drain of the transistor 16t is connected to one of the wirings DL, and the other of the source and the drain of the transistor 16t is connected to one of the wirings SL.

In FIG. 5, the transistor 11 and the transistor 12 are n-channel transistors, and the transistor 16t is a p-channel transistor. One of the wiring DL and the wiring SL corresponds to the wiring 17a (example of the wiring 17 in FIG. 1), and the other of the wiring DL and the wiring SL corresponds to the wiring 17b (example of the wiring 17 in FIG. 1).

Next, the operation of the cell array 30 in FIG. 5 is described with reference to a timing chart in FIG. 6. Note that FIG. 6 illustrates the case where data writing, data retention, and data reading are performed on the memory cell 14 in a first row and a first column, the memory cell 14 in the first row and an x-th column, the memory cell 14 in a y-th row and the first column, and the memory cell 14 in the y-th row and the x-th column.

Figure 6:
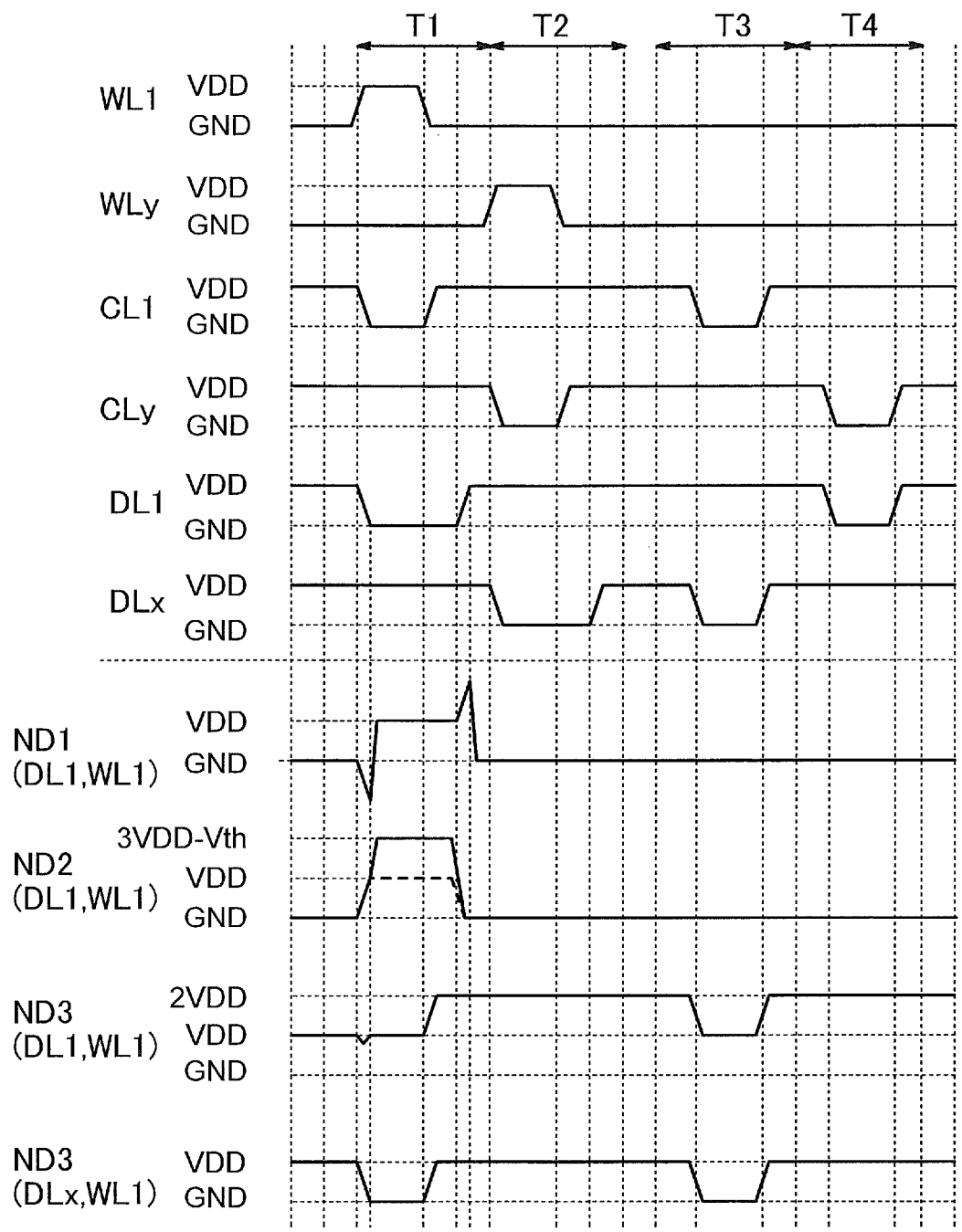
FIG. 6 is a timing chart of a cell array.

In FIG. 6, the ground potential (GND) is used as a low-level potential.

First, in a period T1, the wiring WL1 and the wiring CL1 included in the memory cells 14 in the first row are selected. Specifically, in FIG. 6, the high-level potential (VDD) is supplied to the wiring WL1, and the low-level potential (GND) is supplied to the wirings WL2 to WLy. In addition, the potential (VDD) is supplied to the wiring SL and the wiring VL. Thus, the transistors 11 included in the memory cells 14 in the first row are selectively turned on. Furthermore, the potential (GND) is supplied to the wiring CL1, and the potential (VDD) is supplied to the wirings CL2 to CLy.

In a period during which the wiring WL1 and the wiring CL1 are selected, potentials of signals including data are supplied to the wirings DL1 and DLx. The levels of the potentials supplied to the wirings DL1 and DLx are naturally different depending on the content of data. FIG. 6 illustrates the case where the potential (GND) is supplied to the wiring DL1 and the potential (VDD) is supplied to the wiring DLx. The polarities of the potentials supplied to the wirings DL1 and DLx are inverted by the logic elements 13, and then the inverted potentials are supplied to the gates of the transistors 16t, i.e., the nodes ND3 through the transistors 11 that are on. When the amount of electrical charge accumulated in the nodes ND3 is controlled in accordance with the supplied potentials, data is written to the memory cell 14 in the first row and the first column and the memory cell 14 in the first row and the x-th column.

Note that since the logic element 13 has low current supply capability, with the decrease in potential supplied to the wiring DL1 in the period T1, the potential of the node ND1 in the memory cell 14 connected to the wiring DL1 and the wiring WL1 is decreased because of the capacitance of the logic element 13. With the increase in potential of the node ND1, the potential of the gate of the transistor 11, i.e., the node ND2 is started to be increased because of the capacitance Cs formed between the source and the gate of the transistor 11. Thus, the potential of the other of the source and the drain of the transistor 12 that is connected to the node ND2 becomes higher than the potential (VDD−Vth), so that the transistor 12 is turned off. Consequently, the gate of the transistor 11, i.e., the node ND2 becomes floating. Even after the node ND2 becomes floating, the potential of the node ND2 is continuously increased. Ideally, the potential of the node ND2 can be increased to the potential (3VDD−Vth) obtained by addition of a difference between the low-level potential (−VDD) and the high-level potential (VDD) to the potential (VDD−Vth). Consequently, the potential (VDD) supplied to the node ND1 in data writing can be prevented from being decreased by the threshold voltage of the transistor 11, the potential (VDD) can be supplied to the node ND3, and data can be written to the node ND3 at high speed.

Next, the potential (GND) is supplied to the wiring WL1, so that the transistors 11 included in the memory cells 14 in the first row are turned off. Furthermore, the potential (VDD) is supplied to the wiring CL1, so that the potentials of the nodes ND3 are increased. Accordingly, the transistors 16t are turned off regardless of data written to the nodes ND3.

Next, in a period T2, the wiring WLy and the wiring CLy included in the memory cells 14 in the y-th row are selected. Specifically, in FIG. 6, the potential (VDD) is supplied to the wiring WLy, and the potential (GND) is supplied to the wirings WL1 to WL(y−1). In addition, the potential (VDD) is supplied to the wiring SL and the wiring VL. Thus, the transistors 11 included in the memory cells 14 in the y-th row are selectively turned on. Furthermore, the potential (GND) is supplied to the wiring CLy, and the potential (VDD) is supplied to the wirings CL1 to CL(y−1).

In a period during which the wiring WLy and the wiring CLy are selected, potentials of signals including data are supplied to the wirings DL1 and DLx. FIG. 6 illustrates the case where the potential (VDD) is supplied to the wiring DL1 and the potential (GND) is supplied to the wiring DLx. The polarities of the potentials supplied to the wirings DL1 and DLx are inverted by the logic elements 13, and then the inverted potentials are supplied to the gates of the transistors 16$t$, i.e., the nodes ND3 through the transistors 11 that are on. When the amount of electrical charge accumulated in the nodes ND3 is controlled in accordance with the supplied potentials, data is written to the memory cell 14 in the y-th row and the first column and the memory cell 14 in the y-th row and the x-th column.

Note that as in the case of the memory cell 14 connected to the wiring DL1 and the wiring WL1 in the period T1, in the memory cell 14 connected to the wiring DLx and the wiring WLy in the period T2, the potential of the gate of the transistor 11, i.e., the node ND2 can be increased to the potential (3VDD−Vth) ideally. Consequently, the potential (VDD) supplied to the node ND1 in data writing can be prevented from being decreased by the threshold voltage of the transistor 11, the potential (VDD) can be supplied to the node ND3, and data can be written to the node ND3 at high speed.

To prevent writing of incorrect data to the memory cell 14, it is preferable to terminate supply of a signal including data to the wiring DL after a selection period of the wiring WL and the wiring CL is terminated.

Next, the potential (GND) is supplied to the wiring WLy, so that the transistors 11 included in the memory cells 14 in the y-th row are turned off. Furthermore, the potential (VDD) is supplied to the wiring CLy, so that the potentials of the nodes ND3 are increased. Accordingly, the transistors 16$t$ are turned off regardless of data written to the nodes ND3.

In one embodiment of the present invention, the transistor 11 has extremely low off-state current as described above. When the off-state current of the transistor 11 is low, electric charge accumulated in the node ND3 is less likely to leak; thus, data can be retained for a long time.

Next, as shown in a period T3, the wiring CL1 included in the memory cells 14 in the first row are selected. Specifically, in FIG. 6, the potential (GND) is supplied to the wiring CL1, and the high-level potential (VDD) is supplied to the wirings CL2 to CLy. In the period T3, none of the wirings WL is selected by supply of the potential (GND). Furthermore, in a period during which the wiring CL1 is selected, the potential (VDD) is supplied to the wiring SL and the wiring VL.

Resistance between the source and the drain of the transistor 16$t$ depends on the amount of electrical charge accumulated in the node ND3. Thus, a potential based on the amount of electrical charge accumulated in the node ND3 is supplied to the wirings DL1 and DLx. Then, by reading a difference in the amount of electrical charge from the potential, data can be read from the memory cell 14 in the first row and the first column and the memory cell 14 in the first row and the x-th column.

Next, as shown in a period T4, the wiring CLy included in the memory cells 14 in the y-th row are selected. Specifically, in FIG. 6, the potential (GND) is supplied to the wiring CLy, and the high-level potential (VDD) is supplied to the wirings CL1 to CL(y−1). In the period T4, none of the wirings WL is selected by supply of the potential (GND). Furthermore, in a period during which the wiring CLy is selected, the potential (VDD) is supplied to the wiring SL and the wiring VL.

The resistance between the source and the drain of the transistor 16$t$ depends on the amount of electrical charge accumulated in the node ND3. Thus, a potential based on the amount of electrical charge accumulated in the node ND3 is supplied to the wirings DL1 and DLx. Then, by reading a difference in the amount of electrical charge from the potential, data can be read from the memory cell 14 in the y-th row and the first column and the memory cell 14 in the y-th row and the x-th column.

Note that a reading circuit is connected to an end of each wiring DL, and a signal output from the reading circuit includes data actually read from the cell array 30.

<Structure Example of Semiconductor Device>

In a programmable logic device (PLD), which is one of semiconductor devices, a logic circuit is formed using adequate-scale programmable logic blocks (PLE), and the functions of the logic blocks and the connection between the logic blocks can be changed (configured) after manufacture. Specifically, the PLD includes a plurality of logic blocks and a routing resource for controlling the connection between the logic blocks. The functions of the logic blocks and the connection between the logic blocks formed using a routing resource are defined by configuration data, and the configuration data is stored in a storage device included in each logic block or a storage device included in the routing resource.

Figure 7:
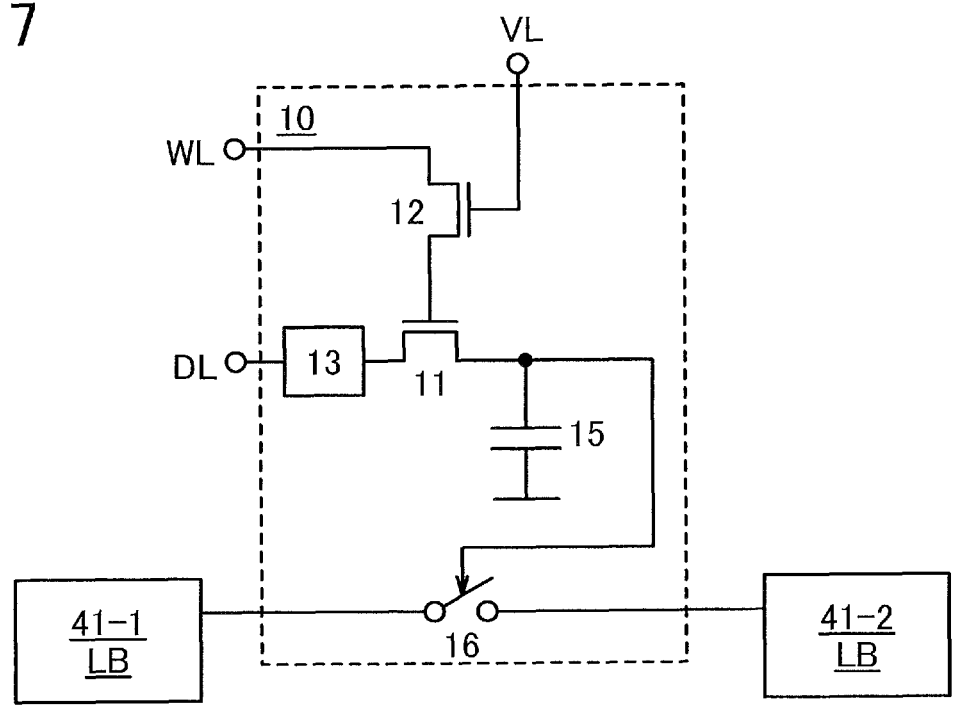
FIG. 7 illustrates a PLD structure.

FIG. 7 illustrates a PLD structure example in which a switch is used as the semiconductor element 16 included in the storage device 10 in FIG. 1 and the electrical connection between a plurality of logic blocks 41 is controlled by the semiconductor element 16.

FIG. 7 illustrates the semiconductor element 16 formed using a transistor functioning as a switch that is turned on or off in accordance with data retained in the storage device 10 and logic blocks 41-1 and 41-2. The electrical connection between the logic blocks 41-1 and 41-2 is controlled by the semiconductor element 16. The logic blocks 41-1 and 41-2 are examples of the plurality of logic blocks (LB) 41.

Specifically, when the semiconductor element 16 is turned on in accordance with data, the logic blocks 41-1 and 41-2 are electrically connected to each other. When the semiconductor element 16 is turned off in accordance with the data, the logic blocks 41-1 and 41-2 are electrically isolated from each other.

Thus, it is possible to control the electrical connection between the logic blocks 41-1 and 41-2 in accordance with the configuration data retained in the storage device 10.

Note that to detect loss of configuration data in the storage device 10 in advance, the storage device 10 for detection may be provided in the PLD. The storage device 10 for detection can have a structure in which an inverter is used as the semiconductor element 16 in the storage device 10 in FIG. 4B, for example. Capacitance of the capacitor 15 connected to the node ND3 and another parasitic capacitance of the storage device 10 for detection are preferably set higher than those of the storage device 10 used as a configuration memory. After configuration is terminated, in the storage device 10 for detection, the potential of the wiring DL is set high and a high-level potential is written to the node ND3. When the potential of the node ND3 becomes lower than the threshold voltage of the semiconductor element 16 (inverter), a potential output from the semiconductor element 16 is changed from a low-level potential into a high-level potential. Thus, by detecting a change in the potential, timing of loss of configuration data can be determined. With such a structure, before the configuration data is lost, it is possible to stop supply of a clock signal and power supply voltage after data used in the PLD is backed up or to require an external memory to rewrite configuration data. Furthermore, if a potential output from the semiconductor element 16 (inverter) is a high-level potential when the PLD is restarted, the PLD can require the external memory to rewrite configuration data.

Figure 8A:
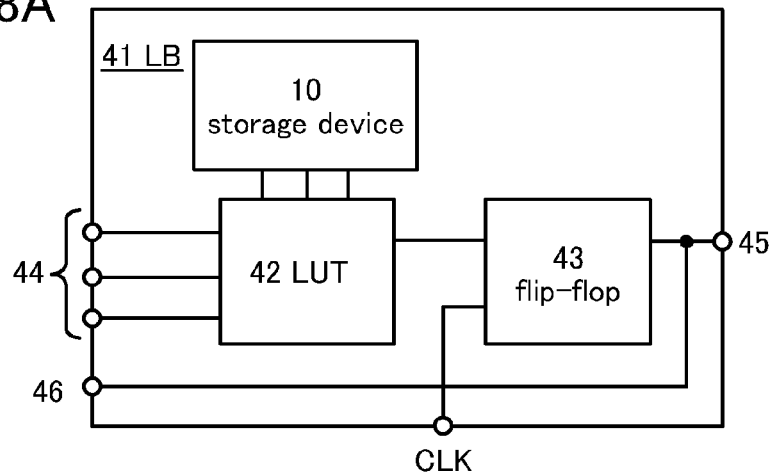
FIGS. 8A to 8C each illustrate a logic block structure.

Next, FIG. 8A illustrates one mode of the logic block (LB) 41. The logic block 41 in FIG. 8A includes a look-up table (LUT) 42, a flip-flop 43, and the storage device 10. Logical operation of the LUT 42 is determined in accordance with configuration data of the storage device 10. Specifically, one output value of the LUT 42 with respect to input values of a plurality of input signals supplied to input terminals 44 is determined. Then, the LUT 42 outputs a signal including the output value. The flip-flop 43 holds the signal output from the LUT 42 and outputs an output signal corresponding to the signal from a first output terminal 45 and a second output terminal 46 in synchronization with a clock signal CLK.

Note that the logic block 41 may further include a multiplexer circuit. The multiplexer circuit can select whether the output signal from the LUT 160 goes through the flip-flop 43.

Furthermore, the type of the flip-flop 43 may be determined by the configuration data. Specifically, the flip-flop 43 may have a function of any of a D flip-flop, a T flip-flop, a JK flip-flop, and an RS flip-flop depending on the configuration data.

Figure 8B:
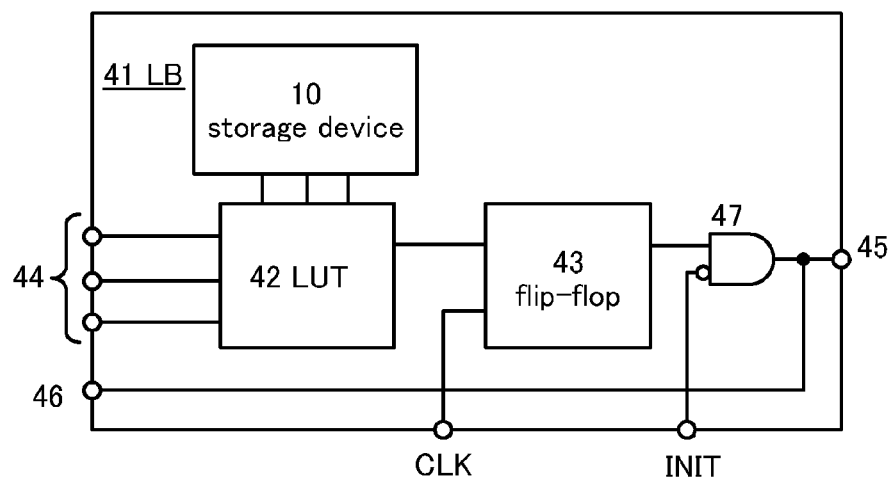

FIG. 8B illustrates another mode of the logic block 41. The logic block 41 in FIG. 8B has a structure in which an AND circuit 47 is added to the logic block 41 in FIG. 8A. To the AND circuit 47, a signal from the flip-flop 43 is supplied as a positive logic input, and a signal INIT is supplied as a negative logic input. With such a structure, the potential of a wiring supplied with a signal output from the logic block 41 can be initialized. Consequently, a large amount of current can be prevented from flowing between the logic blocks 41, so that breakage of the PLD can be prevented.

Figure 8C:
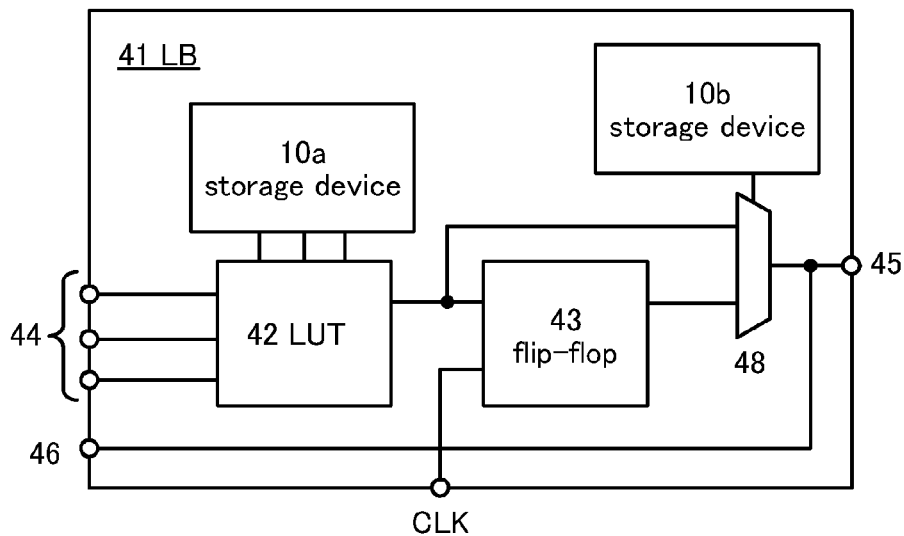

FIG. 8C illustrates another mode of the logic block 41. The logic block 41 in FIG. 8C has a structure in which a multiplexer 48 is added to the logic block 41 in FIG. 8A. The logic block 41 in FIG. 8C further includes two storage devices 10 (storage devices 10a and 10b). Logical operation of the LUT 42 is determined in accordance with configuration data of the storage device 10a. A signal output from the LUT 42 and a signal output from the flip-flop 43 are input to the multiplexer 48. The multiplexer 48 has functions of selecting and outputting one of the two output signals in accordance with configuration data stored in the storage device 10b. The signal output from the multiplexer 48 is output from the first output terminal 45 and the second output terminal 46.

Figure 9A:
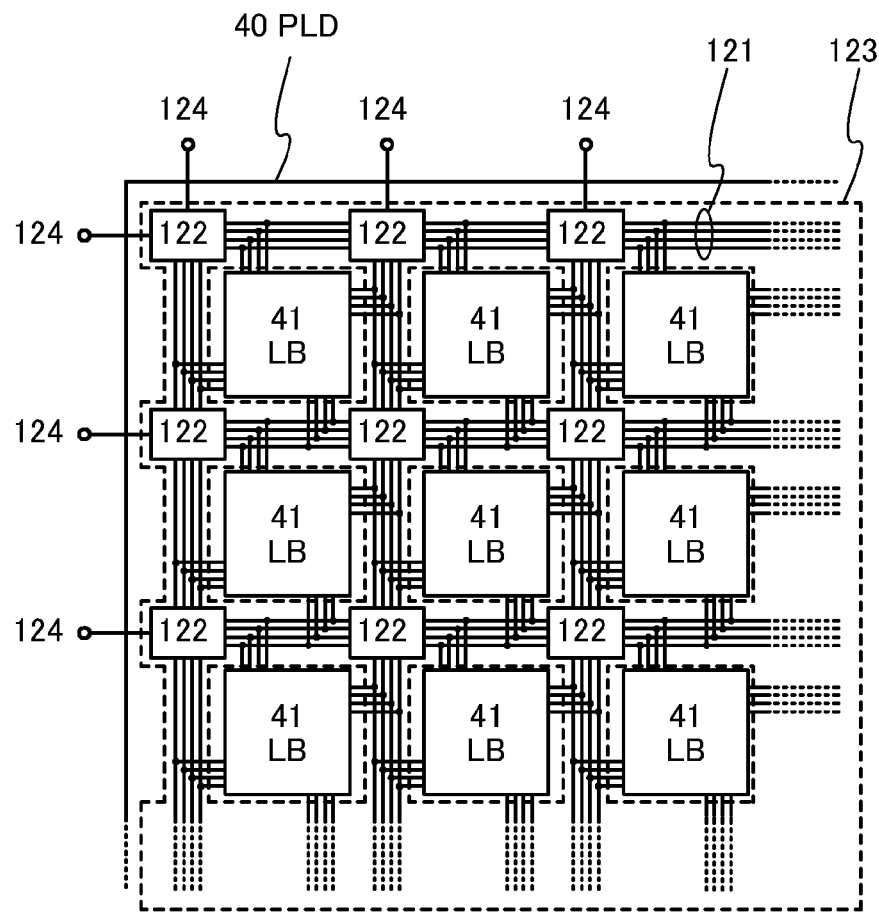
FIG. 9A illustrates part of a PLD structure.

FIG. 9A schematically illustrates part of the structure of a PLD 40. The PLD 40 in FIG. 9A includes the plurality of logic blocks (LB) 41, a wiring group 121 connected to any of the plurality of logic blocks 41, and switch circuits 122 for controlling the connection between the wirings included in the wiring group 121. The wiring group 121 and the switch circuits 122 correspond to a routing resource 123. The connection between the wirings controlled by the switch circuits 122 are determined by the configuration data of the storage device 10.

Figure 9B:
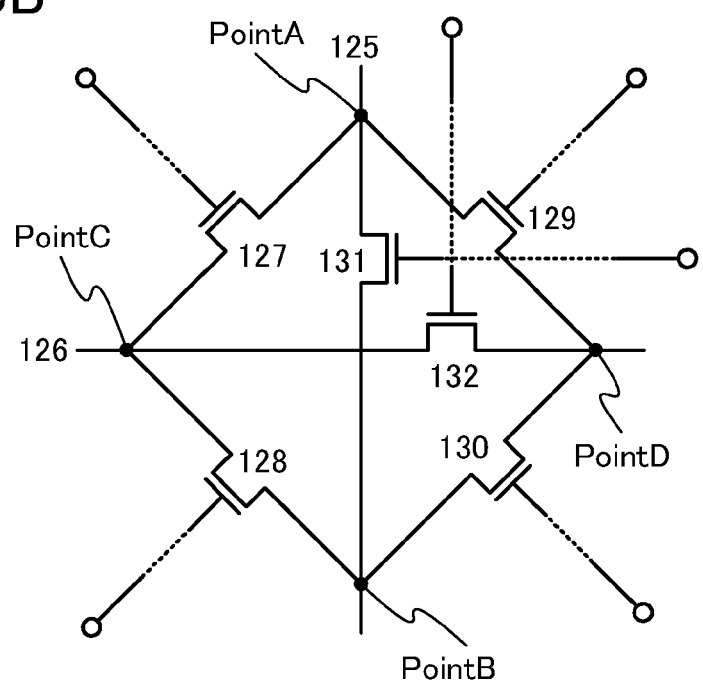
FIG. 9B illustrates a switch circuit structure.

FIG. 9B illustrates a structure example of the switch circuit 122. The switch circuit 122 in FIG. 9B has a function of controlling the connection between a wiring 125 and a wiring 126 included in the wiring group 121. Specifically, the switch circuit 122 includes transistors 127 to 132. The transistors 127 to 132 each correspond to the semiconductor element 16 included in the storage device 10. Thus, the switch circuit 122 and the storage device 10 share the transistors 127 to 132. The transistors 127 to 132 are connected to the nodes ND3 of the plurality of storage devices 10. Selection (switching) of the on state or off state of each of the transistors 127 to 132 is determined by data retained in the node ND3 of the storage device 10.

The transistor 127 has a function of controlling the electrical connection between a point A of the wiring 125 and a point C of the wiring 126. The transistor 128 has a function of controlling the electrical connection between a point B of the wiring 125 and the point C of the wiring 126. The transistor 129 has a function of controlling the electrical connection between the point A of the wiring 125 and a point D of the wiring 126. The transistor 130 has a function of controlling the electrical connection between the point B of the wiring 125 and the point D of the wiring 126. The transistor 131 has a function of controlling the electrical connection between the point A and the point B of the wiring 125. The transistor 132 has a function of controlling the electrical connection between the point C and the point D of the wiring 126.

The switch circuits 122 also have a function of controlling the electrical connection between the wiring group 121 and output terminals 124 of the PLD 40.

Figure 10:
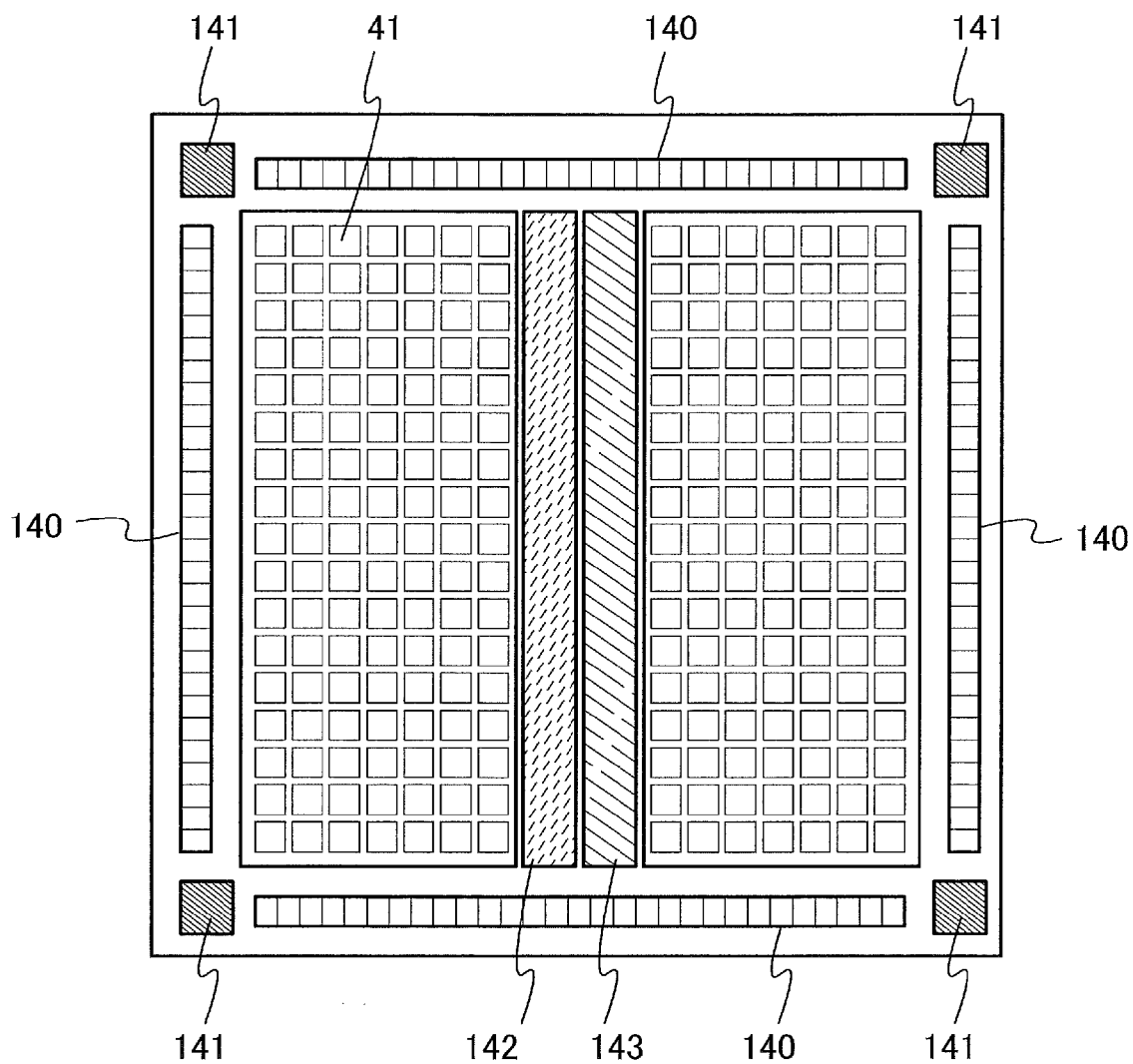
FIG. 10 illustrates a PLD entire structure.

FIG. 10 illustrates a structure example of the entire PLD 40. In FIG. 10, I/O elements 140, phase lock loops (PLL) 141, a RAM 142, and a multiplier 143 are provided in the PLD 40. The I/O element 140 functions as an interface that controls input and output of signals from and to an external circuit of the PLD 40. The PLL 141 has a function of generating a signal CK. The RAM 142 has a function of storing data used for logical operation. The multiplier 143 corresponds to a logic circuit for multiplication. When the PLD 40 has a function of executing multiplication, the multiplier 143 is not necessarily provided.

<Cross-Sectional Structure Example of Cell>

Figure 11:
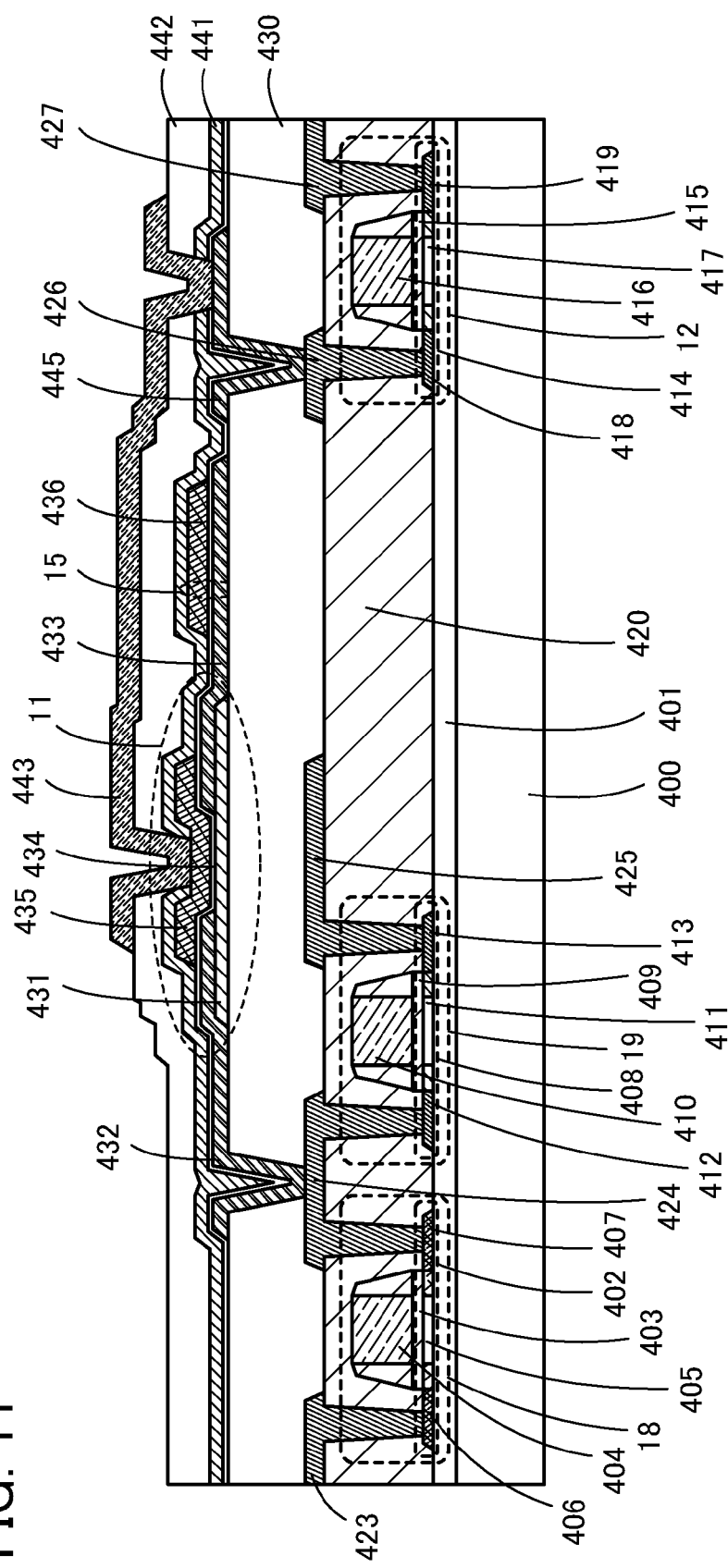
FIG. 11 is a cell cross-sectional view.

FIG. 11 illustrates a cross-sectional structure example of the transistor 11, the transistor 12, the transistor 18, the transistor 19, and the capacitor 15 included in the storage device 10 in FIG. 4A.

In FIG. 11, the p-channel transistor 18, the n-channel transistor 19, and the n-channel transistor 12 are formed in a silicon on insulator (SOI) substrate, and the transistor 11 formed using an oxide semiconductor film is formed above the transistors 18, 19, and 12. The transistors 18, 19, and 12 may each include a semiconductor thin film of silicon, germanium, or the like in an amorphous, microcrystalline, polycrystalline, or single crystal state. Alternatively, the transistors 18, 19, and 12 may each include an oxide semiconductor film. In the case where the transistors each include an oxide semiconductor film, the transistor 11 is not necessarily stacked above the transistors 18, 19, and 12, and the transistors 11, 18, 19, and 12 may be formed over the same insulating surface. The transistors 18, 19, and 12 may be formed using a single crystal silicon substrate. Note that to prevent latch up when a negative potential is supplied to the node ND1, in one embodiment of the present invention, it is preferable to form the transistors 18, 19, and 12 by using a semiconductor thin film provided over the insulating surface.

In the case where the transistors 18, 19, and 12 are each formed using a silicon thin film, any of the following may be used: amorphous silicon formed by sputtering or vapor phase growth such as plasma-enhanced CVD; polycrystalline silicon obtained by crystallization of amorphous silicon by treatment such as laser annealing; and the like.

In FIG. 11, the transistors 18, 19, and 12 are formed over a substrate 400 provided with an insulating film 401.

Although there is no particular limitation on a material that can be used as the substrate 400, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 400. In the case where the temperature of the heat treatment to be performed later is high, a glass substrate whose strain point is 730° C. or higher is preferably used as a glass substrate.

In this embodiment, a semiconductor substrate of single crystal silicon is preferably used as the substrate 400. A single crystal semiconductor substrate has higher surface flatness than a glass substrate. Accordingly, variation in thickness of an insulating film, a conductive film, or the like due to surface unevenness of the substrate can be prevented; thus, electrical characteristics of semiconductor elements such as transistors can be uniform even when the semiconductor elements are downsized.

Specifically, the transistor 18 includes, over the insulating film 401, a crystalline semiconductor film 402, a gate insulating film 403 over the semiconductor film 402, and a gate electrode 404 overlapping with the semiconductor film 402 with the gate insulating film 403 positioned therebetween. The semiconductor film 402 includes a first region 405 functioning as a channel formation region and second regions 406 and 407 that have p-type conductivity and function as a source and a drain. The first region 405 is sandwiched between the second regions 406 and 407.

Specifically, the transistor 19 includes, over the insulating film 401, a crystalline semiconductor film 408, a gate insulating film 409 over the semiconductor film 408, and a gate electrode 410 overlapping with the semiconductor film 408 with the gate insulating film 409 positioned therebetween. The semiconductor film 408 includes a first region 411 functioning as a channel formation region and second regions 412 and 413 that have n-type conductivity and function as a source and a drain. The first region 411 is sandwiched between the second regions 412 and 413.

Specifically, the transistor 12 includes, over the insulating film 401, a crystalline semiconductor film 414, a gate insulating film 415 over the semiconductor film 414, and a gate electrode 416 overlapping with the semiconductor film 414 with the gate insulating film 415 positioned therebetween. The semiconductor film 414 includes a first region 417 functioning as a channel formation region and second regions 418 and 419 that have n-type conductivity and function as a source and a drain. The first region 417 is sandwiched between the second regions 418 and 419.

An insulating film 420 is provided on the transistors 18, 19, and 12. Openings are formed in the insulating film 420. Through the openings, a wiring 423 connected to the second region 406, a wiring 424 connected to the second regions 407 and 412, a wiring 425 connected to the second region 413, a wiring 426 connected to the second region 418, and a wiring 427 connected to the second region 419 are formed on the insulating film 420.

An insulating film 430 is formed over the wirings 423 to 427. The transistor 11, the capacitor 15, and a wiring 445 are formed over the insulating film 430.

The transistor 11 includes, over the insulating film 430, a semiconductor film 431 including an oxide semiconductor; conductive films 432 and 433 that are provided over the semiconductor film 431 and function as source and drain electrodes; a gate insulating film 434 over the semiconductor film 431 and the conductive films 432 and 433; and a gate electrode 435 that overlaps with the semiconductor film 431 in a region between the conductive films 432 and 433 with the gate insulating film 434 positioned between the gate electrode 435 and the semiconductor film 431.

The conductive film 432 is connected to the wiring 424 through the opening formed in the insulating film 430. The wiring 445 is connected to the wiring 426 through the opening formed in the insulating film 430.

A conductive film 436 is provided over the gate insulating film 431 to overlap with the conductive film 433. A portion where the conductive films 433 and 436 overlap with each other with the gate insulating film 434 positioned therebetween functions as the capacitor 15.

Note that FIG. 11 illustrates an example in which the capacitor 15 is provided over the insulating film 430 together with the transistor 11. However, the capacitor 15 may be provided below the insulating film 430 together with the transistors 18, 19, and 12.

An insulating film 441 and an insulating film 442 are stacked in that order over the transistor 11 and the capacitor 15. The insulating film 441 is preferably an insulating film of silicon nitride or the like that can prevent hydrogen released from the insulating film 442 from entering the semiconductor film 431.

Openings are formed in the insulating films 441 and 442 and the gate insulating film 434. A conductive film 443 that is connected to the gate electrode 435 and the wiring 445 through the openings is provided over the insulating film 442.

Note that in FIG. 11, the transistor 11 includes the gate electrode 435 on at least one side of the semiconductor film 431. Alternatively, the transistor 11 may include a pair of gate electrodes with the semiconductor film 431 positioned therebetween.

When the transistor 11 includes a pair of gate electrodes with the semiconductor film 431 positioned therebetween, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 11, the transistor 11 has a single-gate structure where one channel formation region corresponding to one gate electrode 435 is provided. However, the transistor 11 may have a multi-gate structure where a plurality of channel formation regions are formed in one active layer by providing a plurality of gate electrodes electrically connected to each other.

<Semiconductor Film>

A highly-purified oxide semiconductor (purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly-purified oxide semiconductor film has extremely low off-state current and high reliability.

Specifically, various experiments can prove low off-state current of a transistor including a channel formation region in a highly-purified oxide semiconductor film. For example, even when an element has a channel width of $1\times10^6$ µm and a channel length of 10 µm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 to 10 V. In that case, it can be seen that off-state current standardized on the channel width of the transistor is lower than or equal to 100 zA/µm. In addition, a capacitor and a transistor were connected to each other and off-state current was measured using a circuit in which electric charge flowing to or from the capacitor is controlled by the transistor. In the measurement, a highly-purified oxide semiconductor film was used in the channel formation region of the transistor, and the off-state current of the transistor was measured from a change in the amount of electric charge of the capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly-purified oxide semiconductor film in the channel formation region has much lower off-state current than a crystalline silicon transistor.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Furthermore, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Ce—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Furthermore, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

The structure of the oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Furthermore, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

<Electronic Device Examples>

A storage device or semiconductor device according to one embodiment of the present invention can be used for display devices, personal computers, or image reproducing devices provided with recording media (typically, devices that reproduce the content of recording media such as digital versatile discs (DVD) and have displays for displaying the reproduced images). Furthermore, as electronic devices that can include the storage device or semiconductor device according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 12A to 12F illustrate specific examples of these electronic devices.

Figure 12A:
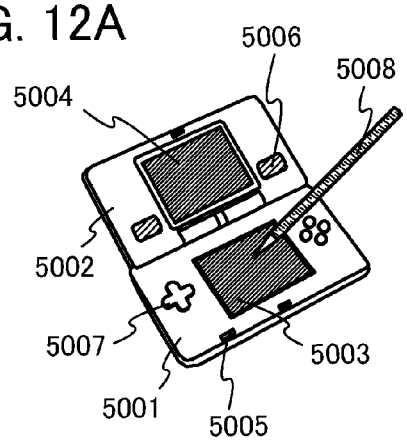
FIGS. 12A to 12F each illustrate an electronic device.

FIG. 12A illustrates a portable game machine, which includes a housing 5001, a housing 5002, a display portion 5003, a display portion 5004, a microphone 5005, speakers 5006, an operation key 5007, a stylus 5008, and the like. Note that although the portable game machine in FIG. 12A has the two display portions 5003 and 5004, the number of display portions included in the portable game machine is not limited thereto.

Figure 12B:
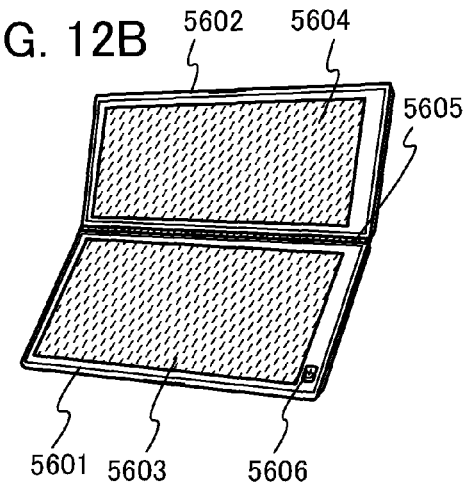

FIG. 12B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 12C:
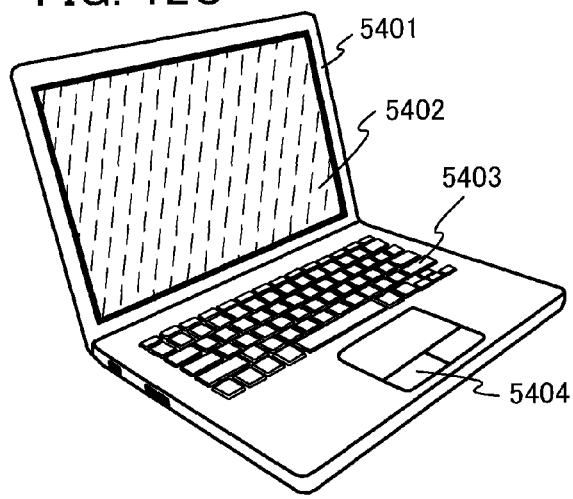

FIG. 12C illustrates a laptop, which includes a housing 5401, a display portion 5402, a keyboard 5403, a pointing device 5404, and the like.

Figure 12D:
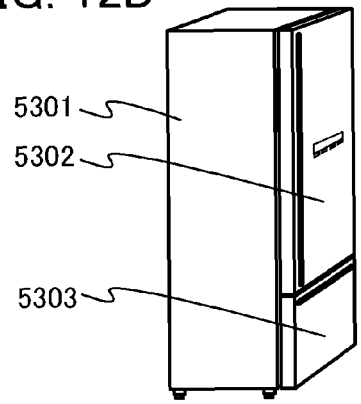

FIG. 12D illustrates an electric refrigerator-freezer, which includes a housing 5301, a refrigerator door 5302, a freezer door 5303, and the like.

Figure 12E:
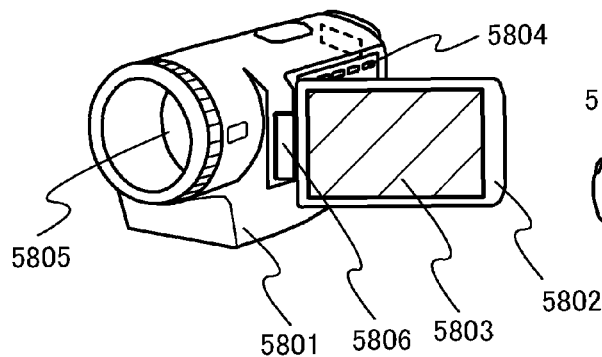

FIG. 12E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 12F:
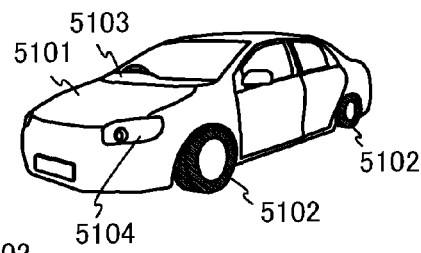

FIG. 12F illustrates an ordinary motor vehicle, which includes a car body 5101, wheels 5102, a dashboard 5103, lights 5104, and the like.

REFERENCE NUMERALS

10: storage device, 10a: storage device, 10b: storage device, 11: transistor, 12: transistor, 13: logic element, 14: memory cell, 15: capacitor, 16: semiconductor element, 16t: transistor, 17: wiring, 17a: wiring, 17b: wiring, 18: transistor, 19: transistor, 20: wiring, 21: wiring, 22: inverter, 30: cell array, 40: PLD, 41: logic block, 41-1: logic block, 41-2: logic block, 42: LUT, 43: flip-flop, 44: input terminal, 45: output terminal, 46: output terminal, 47: AND circuit, 48: multiplexer, 121: wiring group, 122: switch circuit, 123: routing resource, 124: output terminal, 125: wiring, 126: wiring, 127: transistor, 128: transistor, 129: transistor, 130: transistor, 131: transistor, 132: transistor, 140: I/O element, 141: PLL, 142: RAM, 143: multiplier, 400: substrate, 401: insulating film, 402: semiconductor film, 403: gate insulating film, 404: gate electrode, 405: first region, 406: second region, 407: second region, 408: semiconductor film, 409: gate insulating film, 410: gate electrode, 411: first region, 412: second region, 413: second region, 414: semiconductor film, 415: gate insulating film, 416: gate electrode, 417: first region, 418: second region, 419: second region, 420: insulating film, 423: wiring, 424: wiring, 425: wiring, 426: wiring, 427: wiring, 430: insulating film, 431: semiconductor film, 432: conductive film, 433: conductive film, 434: gate insulating film, 435: gate electrode, 436: conductive film, 441: insulating film, 442: insulating film, 443: conductive film, 445: wiring, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: hinge, 5606: operation key, 5801: housing, 5802: housing, 5803: display portion, 5804: operation key, 5805: lens, and 5806: hinge.

This application is based on Japanese Patent Application serial No. 2013-087938 filed with Japan Patent Office on Apr. 19, 2013, the entire contents of which are hereby incorporated by reference.

The invention claimed is:

1. A semiconductor device comprising memory cells in a memory cell array, each of the memory cells comprising:
   a first transistor;
   a second transistor;
   a third transistor;
   a capacitor; and
   a logic element,
   wherein a first terminal of the first transistor is electrically connected to an output terminal of the logic element,
   wherein a first terminal of the second transistor is electrically connected to a gate of the first transistor,
   wherein a second terminal of the first transistor is electrically connected to a terminal of the capacitor and a gate of the third transistor,
   wherein the logic element is configured to change a potential of the first terminal of the first transistor from a first potential into a second potential and then into a third potential when a first signal is input to an input terminal of the logic element,
   wherein the second potential is lower than the first potential, and
   wherein the third potential is higher than the first potential.

2. The semiconductor device according to claim 1,
   wherein the logic element comprises a fourth transistor and a fifth transistor,
   wherein a first terminal of the fourth transistor is electrically connected to a first wiring having the first potential,
   wherein a first terminal of the fifth transistor is electrically connected to a second wiring having the third potential, and
   wherein a second terminal of the fourth transistor is electrically connected to a second terminal of the fifth transistor.

3. The semiconductor device according to claim 1,
   wherein the logic element is configured to change the potential of the first terminal of the first transistor from the first potential into the second potential and then into the third potential when a potential of the first signal changes from the third potential into the first potential.

4. The semiconductor device according to claim 1, further comprising a first inverter,
   wherein the logic element comprises a second inverter,
   wherein the first inverter comprises a fourth transistor,
   wherein the second inverter comprises a fifth transistor,
   wherein an output terminal of the first inverter is electrically connected to an input terminal of the second inverter,
   wherein an output terminal of the second inverter is electrically connected to the first terminal of the first transistor, and
   wherein a channel length of the fifth transistor is more than twice a channel length of the fourth transistor.

5. The semiconductor device according to claim 1,
   wherein the third potential is supplied to a gate of the second transistor and a second terminal of the second transistor when the potential of the first signal changes from the third potential into the first potential.

6. The semiconductor device according to claim 5,
   wherein the first transistor is configured to supply a second signal having the third potential from the second terminal of the first transistor when the potential of the first signal changes from the third potential into the first potential.

7. A semiconductor device comprising memory cells in a memory cell array, each of the memory cells comprising:
a first transistor;
a second transistor;
a third transistor;
a fourth transistor;
a fifth transistor; and
a capacitor,
wherein a first terminal of the first transistor is electrically connected to a first terminal of the fourth transistor and a first terminal of the fifth transistor,
wherein a first terminal of the second transistor is electrically connected to a gate of the first transistor,
wherein a second terminal of the first transistor is electrically connected to a terminal of the capacitor and a gate of the third transistor, and
wherein the first transistor comprises a channel formation region comprising an oxide semiconductor.

8. The semiconductor device according to claim 7,
wherein the fourth and fifth transistors are configured to change the potential of the first terminal of the first transistor from a first potential into a second potential and then into a third potential when a potential of a first signal input to a gate of the fourth transistor and a gate of the fifth transistor changes from the third potential into the first potential,
wherein a second terminal of the fourth transistor is electrically connected to a first wiring having the first potential,
wherein a second terminal of the fifth transistor is electrically connected to a second wiring having the third potential,
wherein the second potential is lower than the first potential, and
wherein the third potential is higher than the first potential.

9. The semiconductor device according to claim 8,
wherein the third potential is supplied to a gate of the second transistor and a second terminal of the second transistor when the potential of the first signal changes from the third potential into the first potential.

10. The semiconductor device according to claim 9,
wherein the first transistor is configured to supply a second signal having the third potential from the second terminal of the first transistor when the potential of the first signal changes from the third potential into the first potential.

11. The semiconductor device according to claim 7, wherein the oxide semiconductor comprises indium, gallium, and zinc.

12. A semiconductor device comprising:
a first transistor;
a fifth transistor;
a logic element;
a first logic block; and
a second logic block,
wherein a first terminal of the first transistor is electrically connected to an output terminal of the logic element,
wherein a second terminal of the first transistor is electrically connected to a gate of the fifth transistor,
wherein a first terminal of the fifth transistor is electrically connected to an output terminal of the first logic block,
wherein a second terminal of the fifth transistor is electrically connected to an input terminal of the second logic block,
wherein the first logic block comprises a first configuration memory configured to store first configuration data,
wherein the second logic block comprises a second configuration memory configured to store second configuration data,
wherein the logic element is configured to change a potential of the first terminal of the first transistor from a first potential into a second potential and then into a third potential when a first signal is input to an input terminal of the logic element,
wherein the second potential is lower than the first potential,
wherein the third potential is higher than the first potential, and
wherein the first transistor comprises a channel formation region comprising an oxide semiconductor.

13. The semiconductor device according to claim 12,
wherein the logic element comprises a second transistor and a third transistor,
wherein a first terminal of the second transistor is electrically connected to a first wiring having the first potential,
wherein a first terminal of the third transistor is electrically connected to a second wiring having the third potential, and
wherein a second terminal of the second transistor is electrically connected to a second terminal of the third transistor.

14. The semiconductor device according to claim 12,
wherein the logic element is configured to change the potential of the first terminal of the first transistor from the first potential into the second potential and then into the third potential when a potential of the first signal changes from the third potential into the first potential.

15. The semiconductor device according to claim 12, further comprising a first inverter,
wherein the logic element comprises a second inverter,
wherein the first inverter comprises a second transistor,
wherein the second inverter comprises a third transistor,
wherein an output terminal of the first inverter is electrically connected to an input terminal of the second inverter,
wherein an output terminal of the second inverter is electrically connected to the first terminal of the first transistor, and
wherein a channel length of the third transistor is more than twice a channel length of the second transistor.

16. The semiconductor device according to claim 12, further comprising a second transistor,
wherein a first terminal of the second transistor is electrically connected to a gate of the first transistor,
wherein the logic element comprises a third transistor and a fourth transistor,
wherein a first terminal of the third transistor is electrically connected to a first wiring having the first potential,
wherein a first terminal of the fourth transistor is electrically connected to a second wiring having the third potential,
wherein a second terminal of the third transistor is electrically connected to a second terminal of the fourth transistor,
wherein the logic element is configured to change the potential of the first terminal of the first transistor from the first potential into the second potential and then into the third potential when a potential of the first signal changes from the third potential into the first potential, and wherein the third potential is supplied to a gate of the second transistor and a second terminal of the second transistor when the potential of the first signal changes from the third potential into the first potential.

17. The semiconductor device according to claim 16, wherein the first transistor is configured to supply a second signal having the third potential from a second terminal of the first transistor when the potential of the first signal changes from the third potential into the first potential.

* * * * *